United States Patent
Yu et al.

(10) Patent No.: US 10,809,588 B2
(45) Date of Patent: Oct. 20, 2020

(54) SCHOTTKY UV SOLAR CELL

(71) Applicants: Hongbin Yu, Chandler, AZ (US); Sandwip Dey, Phoenix, AZ (US); Xiao Di Sun Zhou, Tempe, AZ (US); Ebraheem Azhar, Phoenix, AZ (US)

(72) Inventors: Hongbin Yu, Chandler, AZ (US); Sandwip Dey, Phoenix, AZ (US); Xiao Di Sun Zhou, Tempe, AZ (US); Ebraheem Azhar, Phoenix, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 15/659,150

(22) Filed: Jul. 25, 2017

(65) Prior Publication Data

US 2017/0323990 A1    Nov. 9, 2017

Related U.S. Application Data

(63) Continuation of application No. PCT/US2016/016149, filed on Feb. 2, 2016.
(Continued)

(51) Int. Cl.
*H01L 31/054* (2014.01)
*G02F 1/163* (2006.01)
(Continued)

(52) U.S. Cl.
CPC .......... *G02F 1/163* (2013.01); *G02F 1/13306* (2013.01); *G02F 1/1533* (2013.01); *H01L 31/022491* (2013.01); *H01L 31/054* (2014.12); *H01L 31/07* (2013.01); *H01L 31/073* (2013.01); *H01L 31/1828* (2013.01); *H01L 31/1884* (2013.01); *H02S 20/26* (2014.12); *G02F 1/1524* (2019.01); *G02F 2001/13324* (2013.01); *Y02B 10/10* (2013.01); *Y02E 10/52* (2013.01)

(58) Field of Classification Search
None
See application file for complete search history.

(56) References Cited

U.S. PATENT DOCUMENTS 8,792,169 B2    7/2014    Jiang et al.
9,881,731 B2    1/2018    Yu et al.
(Continued)

FOREIGN PATENT DOCUMENTS

| KR | 10-2010-0092745 | 8/2010 |
|---|---|---|
| KR | 10-2011-0036161 | 4/2011 |
| WO | 2015073873 A1 | 5/2015 |

OTHER PUBLICATIONS

Deb ("Stand-alone photovoltaic-powered electrochromic smart window"), Electrochimica Acta 46 (2001) 2125-2130 (Year: 2001).*
(Continued)

*Primary Examiner* — Devina Pillay
(74) *Attorney, Agent, or Firm* — Snell & Wilmer L.L.P.

(57) ABSTRACT

Optically transmissive UV solar cells may be coupled to glass substrates, for example windows, in order to generate electricity while still providing suitable optical behavior for the window. The UV solar cells may be utilized to power electrochromic components coupled to the window to adjust or vary the transmissivity of the window. The UV solar cells may utilize a Schottky ZnO/ZnS heterojunction.

6 Claims, 17 Drawing Sheets

Related U.S. Application Data

(60) Provisional application No. 62/110,718, filed on Feb. 2, 2015.

(51) Int. Cl.

| | |
|---|---|
| H02S 20/26 | (2014.01) |
| G02F 1/133 | (2006.01) |
| G02F 1/153 | (2006.01) |
| H01L 31/0224 | (2006.01) |
| H01L 31/07 | (2012.01) |
| H01L 31/073 | (2012.01) |
| H01L 31/18 | (2006.01) |
| G02F 1/1524 | (2019.01) |

(56) References Cited

U.S. PATENT DOCUMENTS

| | | | |
|---|---|---|---|
| 10,139,295 B2 | 11/2018 | Yu et al. | |
| 10,390,698 B2 | 8/2019 | Yu et al. | |
| 2009/0255576 A1* | 10/2009 | Tischler | H01L 31/03042 136/255 |
| 2012/0132930 A1 | 5/2012 | Young et al. | |
| 2013/0278989 A1* | 10/2013 | Lam | B60J 3/04 359/275 |
| 2014/0152410 A1 | 6/2014 | Yu et al. | |
| 2014/0198371 A1* | 7/2014 | Conklin | G02F 1/163 359/275 |
| 2014/0199518 A1 | 7/2014 | Yu et al. | |
| 2019/0372097 A1 | 12/2019 | Yu et al. | |

OTHER PUBLICATIONS

Hu ("An Optimized Ultraviolet—A Light Photodetector with Wide-Range Photoresponse Based on ZnS/ZnO Biaxial Nanobelt"), Adv. Mater. 2012, 24, 2305-2309 (Year: 2012).*
Wang ("Synthesis and photovoltaic effect of vertically aligned ZnO/ZnS core/shell nanowire arrays"), Applied Physics Letters 96, 123105 (2010) (Year: 2010).*
Rathmell ("The Synthesis and Coating of Long, Thin Copper Nanowires to Make Flexible, Transparent Conducting Films on Plastic Substrates"), Adv. Mater. 2011, 23, 4798-4803 (Year: 2011).*
PCT; International Preliminary Report on Patentability dated Aug. 8, 2017 in International Application No. PCT/US2016/016149.
PCT; Written Opinion of the International Searching Authority dated Nov. 8, 2016 in International Application No. PCT/US2016/016149.
PCT; International Search Report dated Nov. 8, 2016 in International Application No. PCT/US2016/016149.
Penghui Guo et al., 'ZnS/ZnO heterojunction as photoelectrode: Type II band alignment towards enhanced photoelectrochemical performance', vol. 38, Issue 29, pp. 13097-13103, (Sep. 30, 2013). See pp. 13097, 13098.
C. Kielich. "Keep Your Cool and Save Money Too: Summer Energy-Saving Tips from the Department of Energy" < http://www.energy.gov/news/archives/1652.htm>.
S. K. Deb, S. H. Lee, C. E. Tracy, J. R. Pitts, B. A. Gregg, H. M. Branz. "Stand-alone photovoltaicpowered electrochromic smart window." Electrochromica Acta, 46, 2125-2130. (2001).
J. Qi, J. Peterson. "Nanocomposite Polymers for Smart Window Films." DOE Grant No. DE-FG02-04ER84117 (2001).
A. Anders, Lawrence Berkeley National Laboratory. "Energy Efficient "Smart" Windows."<http://techportal.eere.energy.gov/technology.do/techID=31>.
K.S. Ahn, S. J. Yoo, M. S. Kang, J. W. Lee, Y. E. Sung. "Tandem Dye sensitized solar cell-powered electrohromic devices for the photyovoltaic-powered smart window." Journal of Power Sources 168, 533-6 (2007).
M. G. Kang, N. G. Park, Y. JJ. Park, K. S. Ryu, S. H. Chang. "Manufacturing method for transparent electric windows using dye-sensitized TiO2 solar cells." Solar Energy Materials and Solar Cells 75, 475-9 (2003).
Ma, R. H. & Chen, Y. C. BIPV-Powered Smart Windows Utilizing Photovoltaic and Electrochromic Devices. Sensors 12, 359-372, doi:10.3390/s120100359 (2012).
M. Law, L Greene, J. Johnson, R. Saykally, P. Yang. "Nanowire dye-sensitized solar cells." Nature Materials, 4 455-9. (2005).
Z. Fan, J. Ho, T. Takahasi, R. Yerushalmi, K Takai, A Ford, Y Chueh, K Javey. "Toward the Development of Printable nanowire Electronics and Sensors." Adv. Materials 21, 3730-43. (2009).
R. Baily-Salzman, B. Rand. "Semi-transparent organic photovoltaic cells." App. Phys. Letters 88, 233502 (2006).
J. Baxter, E Ayudil. "Nanowire-based dye-sensitized solar cells." App. Phys. Letters 86, 053114 (2005).
R. Thomas, R. North, and C. Norman, "Low-Cost—High-Efficiency Mis-Inversion Layer Solar-Cells," Electron Device Letters, vol. 1, No. 5, pp. 79-80, 1980.
Y. C. M. Yeh and R. J. Stim, "A Schottky-barrier solar cell on sliced polycrystalline GaAs," Applied Physics Letters, Sep. 1978.
Z. T. Chen, S. X. Tan, Y. Sakai, and T. Egawa, "Improved performance of InAlN-based Schottky solarblind photodiodes," Appl. Phys. Lett., vol. 94, No. 21, p. 213504, May 2009.
X. Li, H. H Zhu, K. K Wang, A. Cao, J. Wei, C. Li, Y. Jia, Z. Li, X. Li, and D. Wu, "Graphene-On-Silicon Schottky Junction Solar Cells," Adv. Mater., vol. 22, No. 25, pp. 2743-2748, Jul. 2010.
L. Olsen, R. Bohara, and M. Urie, "Explanation for Low-Efficiency Cu2o Schottky-Barrier Solar-Cells," Appl. Phys. Lett., vol. 34, No. 1, pp. 47-49, 1979.
R. J. Iwanowski, "n—Voc diagram and the physics of native interfacial layer of the Schottky barrier," Phys. Scr., vol. 37, No. 5, p. 790, May 1988.
Y. Ye, Y. Dai, L. Dai, Z. Shi, N. Liu, F. Wang, L. Fu, R. Peng, X. Wen, Z. Chen, Z. Liu, and G. Qin, "High-Performance Single CdS Nanowire (Nanobelt) Schottky Junction Solar Cells with Au/Graphene Schottky Electrodes," ACS Appl. Mater. Interfaces, vol. 2, No. 12, pp. 3406-3410, Dec. 2010.
A. Ghosh, C. Fishman, and T. Feng, "Sno2-Si Solar-Cells—Heterostructure or Schottky-Barrier or Mis-Type Device," J. Appl. Phys., vol. 49, No. 6, pp. 3490-3498, 1978.
H. Tsubomura and H. Kobayashi, "Solar cells," Critical Reviews in Solid State and Materials Sciences, vol. 18, No. 3, pp. 261-326, Jan. 1993.
L. Li, G. Meng, H. Wang, T. Zhai, X. Fang, U. K. Gautam, X. Fang, Y. Bando, and D. Golberg, "Highyield synthesis of single-crystalline zinc oxide nanobelts and their applications in novel Schottky solar mils," Chem. Commun., vol. 47, No. 29, pp. 8247-8249, Jul. 2011.
R. Hezel, "High-efficiency OECO Czochralski-silicon solar cells for mass production," Solar Energy Materials and Solar Cells, vol. 74, No. 1-4, pp. 25-33, Oct. 2002.
Brinson, L. J. Transition in Schottky-Barrier Formation With Chemical Reactivity. Physical Review Letters 40, 260-263, doi:10.1103/PhysRevLett.40.260 (1978).
Peter, L. M. Towards sustainable photovoltaics: the search for new materials. Philosophical Transactions of the Royal Society a-Mathematical Physical and Engineering Sciences 369, 1840-1856, doi:10.1098/rsta.2010.0348 (2011).
P. V. V Alluri, P. P Majhi, D. Tang, S. K. Dey, "ECR-MOCVD of the Ba-Sr-Ti-O system below 400°C, Part1: Processing" Integrated Ferroelectrics, 21, 305-318 (1998).
S. Rühle, A. Y. Anderson, H.-N. Barad, B. Kupfer, Y. Bouhadana, E. Rosh-Hodesh, and A. Zaban, "All-Oxide Photovoltaics," J. Phys. Chem. Lett., vol. 3, No. 24, pp. 3755-3764, Dec. 2012.
S. Rühle, H. N. Barad, Y. Bouhadana, D. A. Keller, A. Ginsburg, K. Shimanovich, K. Majhi, R. Lovrincic, A. Y. Anderson, and A. Zaban, "Combinatorial solar cell libraries for the investigation of different metal back contacts for TiO2—Cu2O hetero-junction solar cells," Phys. Chem. Chem. Phys., vol. 16, No. 15, pp. 7066-7073, Mar. 2014.
R. C. Lima, L. R. Macario, J. W. M. Espinosa, V. M. Longo, R. Erlo, N. L. Marana, J. R. Sambrano, M. L. dos Santos, A. P. Moura, P. S. Pizani, J. Andre's, E. Longo, and J. A. Varela, "Toward an Understanding of Intermediate—and Short-Range Defects in ZnO Single

(56) References Cited

OTHER PUBLICATIONS

Crystals. A Combined Experimental and Theoretical Study," J. Phys. Chem. A. 112, 8970 (2008).

G. K. Paul, R. Ghosh, S. K. Bera, S. Bandyopadhyay, T. Sakurai, and K. Akimoto, "Deep level transient spectroscopy of cyanide treated polycrystalline p-Cu2O/n-ZnO solar cell," Chemical Physics Letters, vol. 463, No. 1-3, pp. 117-120, Sep. 2008.

R. J. Kaplar, D. Kwon, S. A. Ringel, A. A. Alterman, S. R. Kurtz, E. D. Jones, and R. M. Sieg, "Deep levels in p- and n-type InGaAsN for high-efficiency multi-junction III—V solar cells," Solar Energy Materials and Solar Cells, vol. 69, No. 1, pp. 85-91, Aug. 2001.

Kim, Jae-Hoon et al. Journal of the Korean Physical Society. vol. 53 Issue: 5 p. 2374-2377 (2008).

Wenckstern, H. von e al. Journal of the Korean Physical Society. vol. 53 Issue: 5 pp. 2861-2863 (2008).

O. Breitenstein, J. P. Rakotoniaina, M. H. Al Rifai, and M. Werner, "Shunt types in crystalline silicon solar cells," Prog. Photovolt: Res. Appl., vol. 12, No. 7, pp. 529-538, Nov. 2004.

S. A. Galloway, P. R. Edwards, and K. Durose, "Characterisation of thin film CdS/CdTe solar cells using electron and optical beam induced current," Solar Energy Materials and Solar Cells, vol. 57, No. 1, pp. 61-74, Feb. 1999.

P. R. Edwards, S. A. Galloway, and K. Durose, "EBIC and luminescence mapping of CdTe/CdS solar cells," Thin Solid Films, vol. 361-362, pp. 364-370, Feb. 2000.

D. S. Ghosh, L. Martinez, S. Giurgola, P. Vergani and V. Pruneri, Optics Letters, 2009, 34, 325-327.

O'Connor, B., Haughn, C., An, K. H., Pipe, K. P. & Shtein, M. Transparent and conductive electrodes based on unpatterned, thin metal films. Applied Physics Letters 93, doi:10.1063/1.3028046 (2008).

Hu, L. B., Wu, H. & Cui, Y. Metal nanogrids, nanowires, and nanofibers for transparent electrodes. Mrs bulletin 36, 760-765, doi:10.1557/mrs.2011.234 (2011).

Chang, Y., Lye, M. L. & Zeng, H. C. Large-scale synthesis of high-quality ultralong copper nanowires. langmuir 21, 3746-3748, doi:10.1021/la050220w (2005).

Rathmell, A. R., Bergin, S. M., Hua, Y. L., Li, Z. Y. & Wiley, B. J. The Growth Mechanism of Copper Nanowires and Their Properties in Flexible, Transparent Conducting Films. Advanced Materials 22, 3558-+, doi:10.1002/adma.201000775 (2010).

Guo, H. Z. et al. Copper Nanowires as Fully Transparent Conductive Electrodes. Scientific Reports 3, doi:10.1038/srep02323 (2013).

C. J. Yu, K O'Brien, Y. H. Zhang, H. B. Yu, and H. Q. Jiang, 'Tunable optical gratings based on buckled nanoscale thin films on transparent elastomeric substrates'. Appl. Phys. Lett. 96 (4), 3. (2010).

K. Chen, E. Azhar, T. Ma, H. Jiang, and H. B. Yu, 'Facile Large-Area Photolithography of Periodic Sub-Micron Structures Using a Self-Formed Polymer Mask',. Applied Physical Letters 100, 233503, (2012).

T. Ma, H. Liang, G. Chen, B. Poon, H. Jiang, and H. Yu, 'Microstrain sensing using wrinkled stiff thin films on soft substrates as tunable optical grating'. Optics Express 21, 11994-12001 (2013).

H. B. Yu, E. A. Azhar, T. Belagodu, S. Lim, and S. Dey, 'ZnO nanowire based visible-transparent ultraviolet detectors on polymer substrates'. J. Appl. Phys. 111 (10), 5 (2012).

T. Belagodu, E. A. Azhar, and H. B. Yu, 'Modulation of Charge Conduction in ZnO Nanowires Through Selective Surface Molecular Functionalization', Nanoscale 4, DOI: 10.1039/C1032NR31442H (2012).

Hanshuang Liang, Teng Ma, Cheng Lv, Hoa Nguyen, George Chen, Hao Wu, Rui Tang, Hanging Jiang, Hongbin Yu, High Sensitivity In-Plane Strain Measurement Using a Laser Scanning Technique, IEEE Electronic Components and Technology Conference, Orlando, FL, May 2014.

Ebraheem Ali Azhar, Sandwip K. Dey, and Hongbin Yu, "Synthesis and fabrication of Schottky Barrier Zinc Oxide Hybrid organic Thin Film Solar Cells for Smart Window Applications," K10.02. Materials Research Society Spring Meeting 2014. San Francisco, CA.

* cited by examiner

SCHOTTKY UV SOLAR CELL

CROSS-REFERENCE TO RELATED APPLICATIONS

This application is a continuation of PCT/US2016/016149 entitled "SCHOTTKY UV SOLAR CELL AND APPLICATIONS THEREOF" filed on Feb. 2, 2016. PCT/US2016/016149 claims priority to, and the benefit of, U.S. Provisional Application No. 62/110,718 entitled "SCHOTTKY UV SOLAR CELL AND APPLICATIONS THEREOF" filed on Feb. 2, 2015. Each of the aforementioned applications is incorporated herein by reference in their entirety for all purposes.

FEDERALLY SPONSORED RESEARCH OR DEVELOPMENT

This invention was made with government support under grant number 1143570 awarded by the National Science Foundation. The Government has certain rights in the invention.

TECHNICAL FIELD

The present disclosure relates to ultraviolet solar cells configured with Schottky junctions, and in particular to use of ultraviolet solar cells in connection with electrochromic systems.

BACKGROUND

Conventional solar cells are desirably utilized to generate electrical current from sunlight. However, such cells are generally opaque to visible light, and as such cannot be deployed on or in windows or other areas. In particular, combining electrochromic or "smart" windows with self-powering capabilities, for example by coupling to a solar cell, results in devices capable of significant energy savings for buildings. Accordingly, improved ultraviolet solar cells and related materials remain desirable, as such solar cells may be generally transparent to visible light and thus integrated on or in a window.

BRIEF DESCRIPTION OF THE DRAWINGS

With reference to the following description and accompanying drawings.

DETAILED DESCRIPTION

Figure 1:
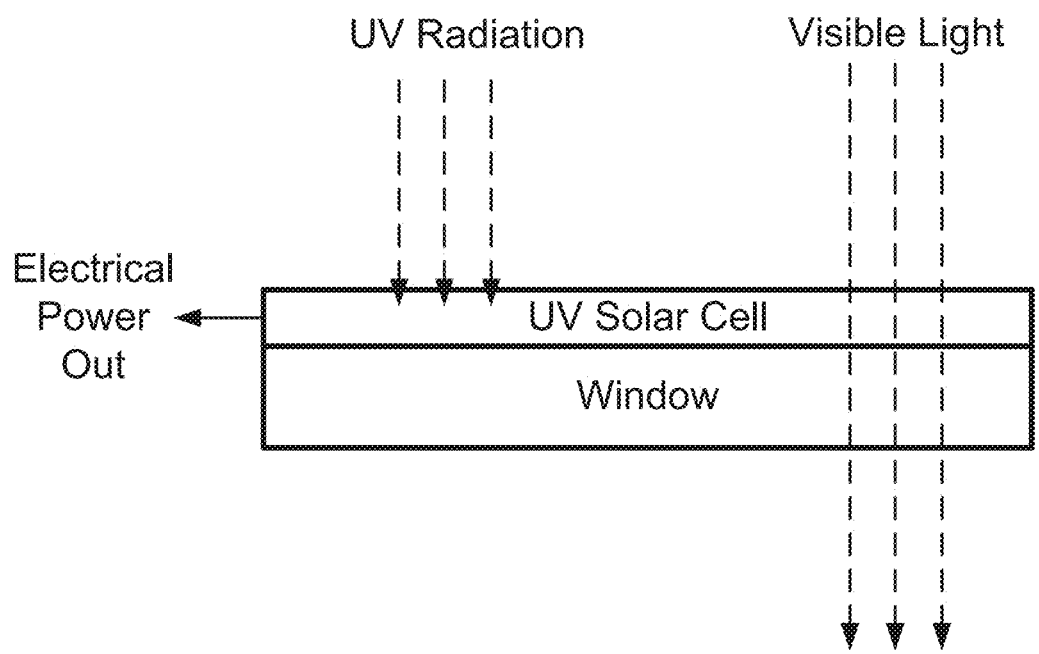
FIG. 1 illustrates a conceptual diagram for a transparent solar cell in accordance with an exemplary embodiment.

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from the scope of the present disclosure.

For the sake of brevity, conventional techniques for semiconductor materials and/or device fabrication and testing may not be described in detail herein. Furthermore, the connecting lines shown in various figures contained herein are intended to represent exemplary functional relationships and/or physical couplings between various elements. It should be noted that many alternative or additional functional relationships or physical connections may be present in practical photovoltaic devices configured with a Schottky junction.

With reference now to FIGS. 1 through 16C, principles of the present disclosure disclose integration of visible wavelength-transparent, UV-absorbing and voltage-generating photovoltaic (PV) devices, comprised of Metal-ZnS/ZnO Schottky junctions onto a well-established electrochromic stack. This enables, for example, autonomous (or self-powered) photo-electrochromic systems at low cost. Because the PV device operates in the ultraviolet (UV) region with relatively low photovoltaic power conversion efficiency in comparison to conventional solar cells, an important consideration is the open circuit voltage ($V_{OC}$) to drive the electrochromic stack. Accordingly, principles of the present disclosure facilitate (a) synthesis of ZnO thin films by a low temperature, low cost solution deposition technique, (b) partially converting the ZnO to ZnS in a sulfurizing environment to form the ZnO/ZnS heterojunction, (c) fabricating structures via the use of Au, Ag, and/or or Cu on ZnS/ZnO heterojunction, (d) characterizing the materials and devices in each step of the processing and fabrication cycles, (e) maximizing the $V_{OC}$ (~2V) and short circuit current of the devices via feedback from device simulations, and (f) integration of the PV device onto a photo-electrochromic system.

Principles of the present disclosure contemplate an integrated approach which is transformative in a number of areas. In addition to the realization of smart windows that are self-powered, and utilization of earth-abundant materials and simple design, exemplary embodiments open up numerous opportunities using ZnS/ZnO film-based devices. For example, optical devices, such as light-emitting diodes, optically pumped lasers, and transparent thin-film transistors may be realized. Also, chemical, gas, and bio sensing, as well as solar cell applications may be exploited. Furthermore, novel integration strategies bring innovation from concept-to-commercialization at an accelerated pace in this rapidly growing field of transparent metal oxide-based applications.

Principles of the present disclosure are in harmony with the following objectives: 1. Uses sustainable and renewable energy source of sunlight; 2. Discloses a cost-effective, solution-based process, including the synthesis of ZnO/ZnS heterostructure and Cu Schottky barrier contacts, which can be readily scaled up for large-scale production; 3. Utilizes earth-abundant materials: Zn, S, O, and Cu; and 4. Materials, system design, and processing strategies may be used to retrofit existing and vast amounts of windows on buildings/vehicles.

Principles of the present disclosure facilitate development of transformative ZnS/ZnO-based, energy-saving devices. Smart windows have received much attention over the years for the potential to dramatically reduce energy consumption. The US Department of Energy (DOE) estimates that advanced dynamic window technologies, or smart windows, in buildings could save as much as 1.5 quadrillion BTUs of energy, or more than $15 billion in cost each year. A reduced energy demand for buildings leads to lower energy needs currently dependent on foreign sources, as well as decreases the amount of greenhouse gas emissions.

Within the past few decades, the DOE has served as the guide and motivator for standardizing public knowledge of both energy conservation and surveying new sources for energy. In fact, the DOE maintains a list of techniques for conserving power in homes and commercial buildings. Within that list, it is estimated that 20-50% of heat absorption occurs from sunlight radiation through windows. However, more specifically, it is projected that removing cooling loads from windows totals about 1.5 quadrillion BTUs per year, which equates to a cost of almost $15 billion. Additionally, a staggering 2 billion square meters of flat glass is produced worldwide each year for the purposes of both residential and commercial windows. While a small fraction of these windows encompass energy-saving design features (such as low-emissivity coating, argon filling, and vacuum insulation), these solutions still ultimately render the window passive. Such large areas have massive potential for power generation and integration of self-powered electronics, sensors, and displays while retaining nearly identical optical properties.

The US government has already invested millions on "smart" windows, i.e., windows in which light transmission properties can be controlled by an external stimulus. Funded research has included electrochromics and phase-changing glasses that respond to heat pulses. However, these techniques require external power to generate the desired effect. Therefore, desire for autonomous or self-powered smart-window systems is obvious, appealing, and urgent. Recent work on integrating smart window designs with photovoltaics to increase energy savings has demonstrated significant promise. However, these prior techniques vary in success and their feasibility is in question—predominantly lacking a production-worthy process that is reproducible and cost-effective. Also, such prior systems typically employ multiple materials in complex designs, and are fabricated on rigid and inflexible surfaces with the inability to conform or perhaps retrofit to windows that are contoured (e.g., car windshield or the like).

In recent years, a field of major interest has been the fabrication of integrated circuits, not onto conventional substrates such as silicon (Si), but rather onto flexible and transparent substrates. Indeed, tremendous progress has been made in flexible and transparent electronics, as demonstrated by the emergence of exciting flexible displays, e-papers, and radio frequency identification (RFID) devices. This has been feasible due to light weight, compact form factor, conformable, low cost, shock resistance, and versatility of multifunctionality. Beyond just information display, integrated multifunctionality on flexible and transparent substrates will certainly drive capabilities further. For example, electrochromic windows around a residence are usable to partially block visible light and prevent it from entering a building. By itself, the material is simply a passive element, but possesses the capability of integrating many more features, including complex transparent circuitry and photovoltaic devices. The flexibility of the electrochromic device also allows it to be attached to a variety of complex surfaces, for example for smart window applications and energy harvesting. Coupled with the task of reducing a structure's internally absorbed heat, a completely self-powered smart window eliminates the need for external power sources and further alleviates future energy demands. For example, a 1 KW PV device can remove heat at approximately 3 W from a building envelope during cooling, whereas the same device can be used to drive smart windows so as to avert an estimated electricity consumption of 110 KW; resulting in enormous energy savings.

Figure 2A:
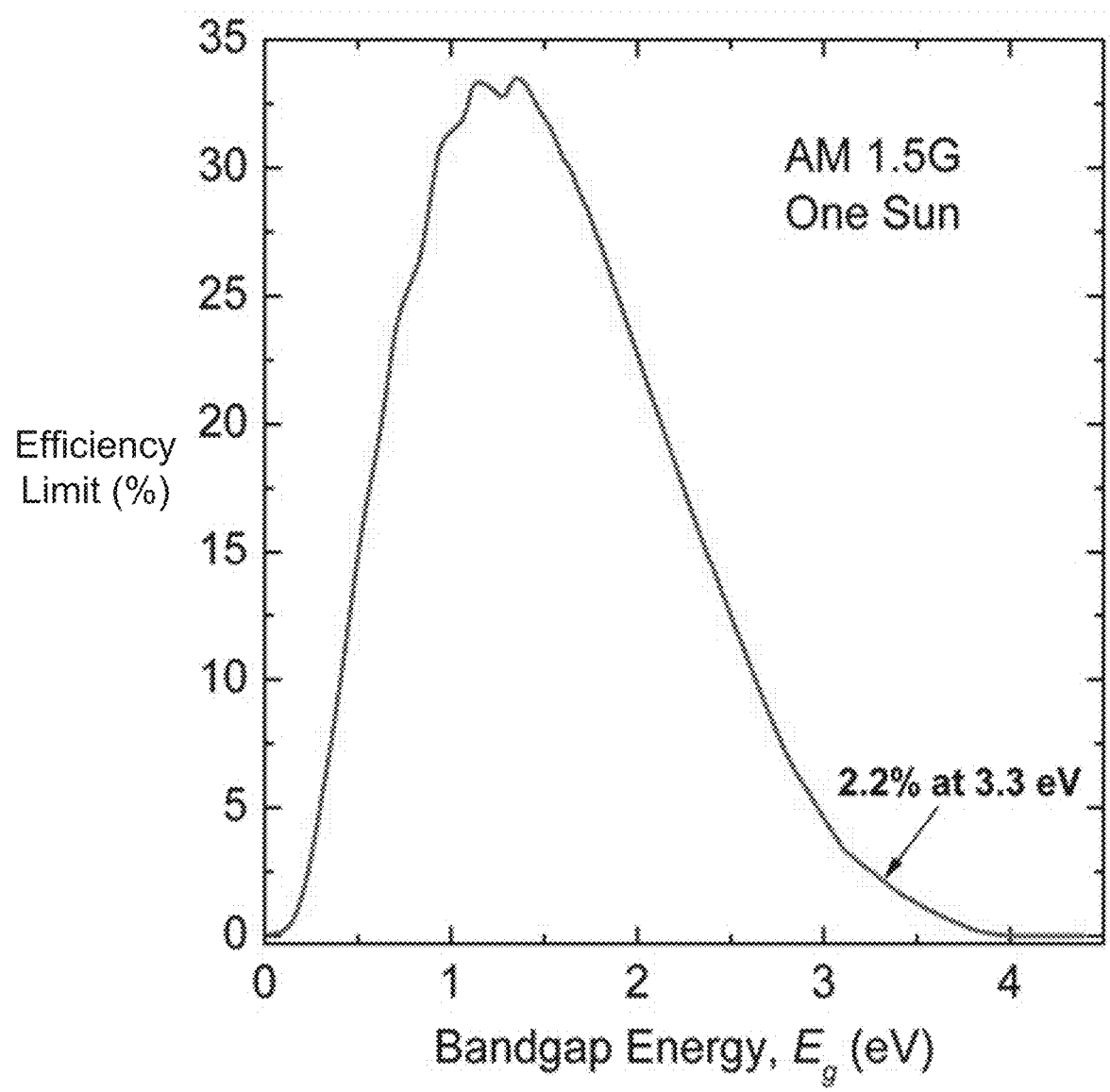
FIG. 2A illustrates efficiency limit vs. bandgap energy for Zinc Oxide (ZnO) in accordance with an exemplary embodiment.
Figure 2B:
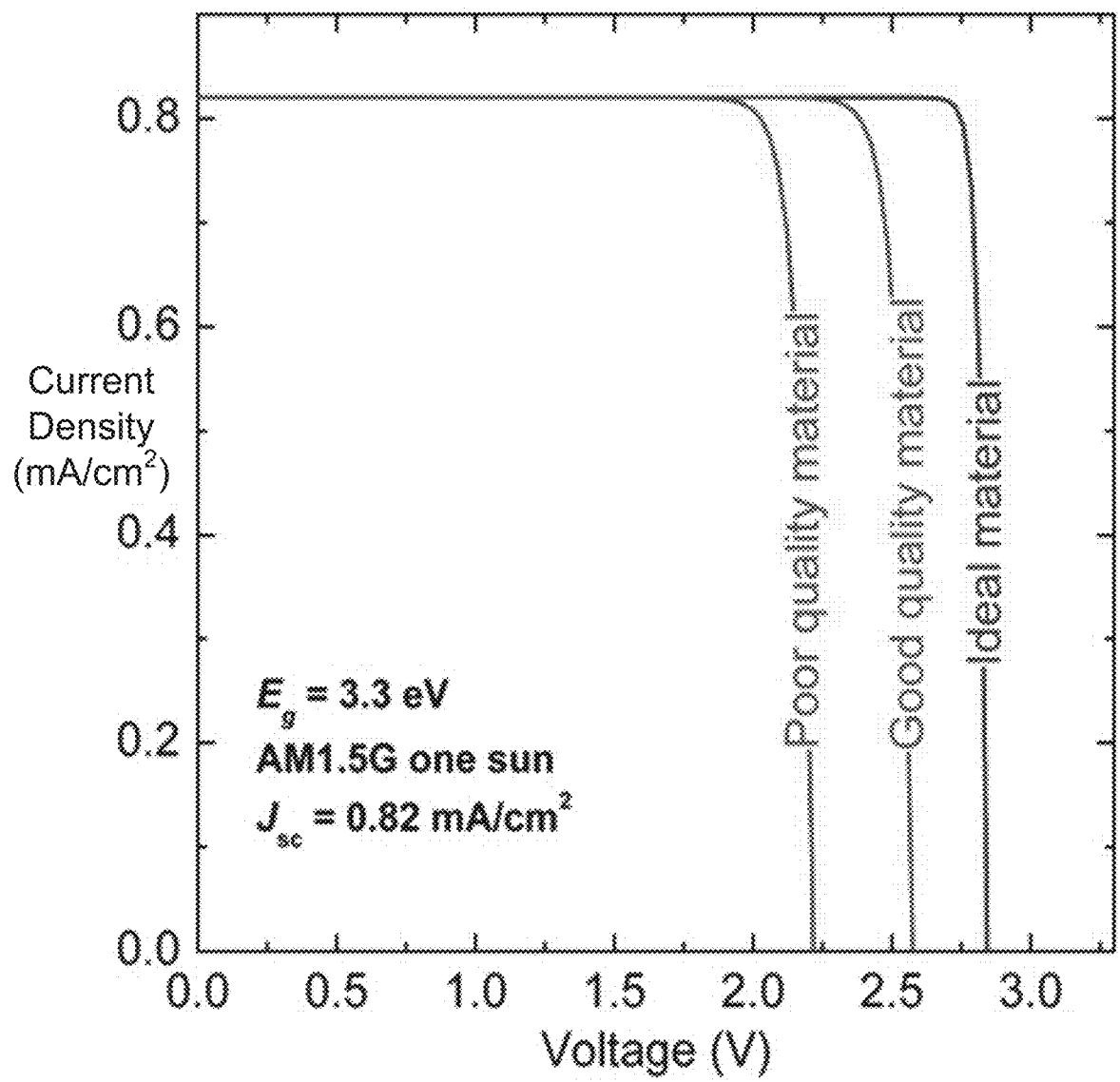
FIG. 2B illustrates current density vs. voltage for various quality ZnO materials in accordance with an exemplary embodiment.
Figure 3:
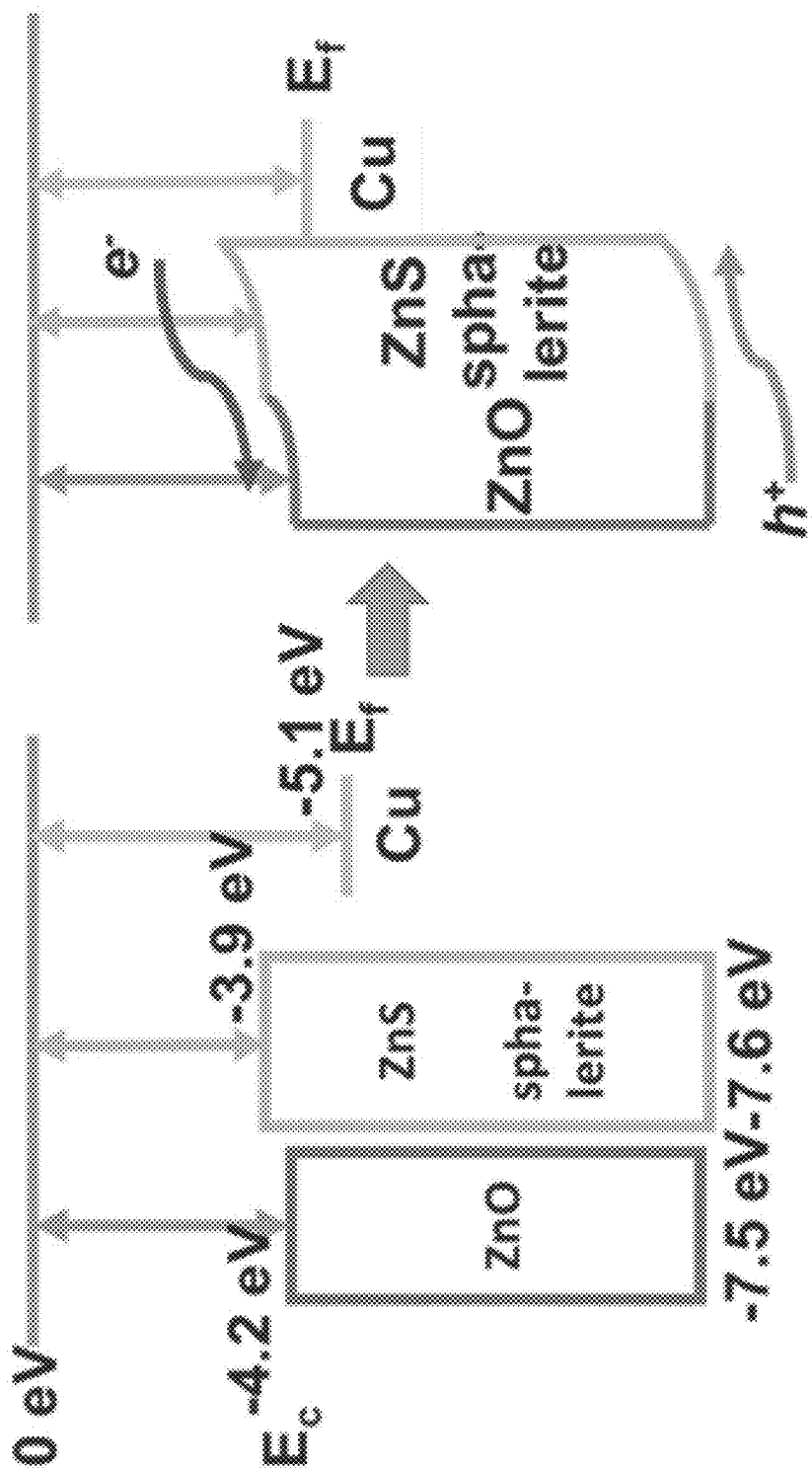
FIG. 3 illustrates an energetic band diagram before contact and after contact in accordance with an exemplary embodiment.

Previously, smart windows with integrated photovoltaic capabilities have been made with dye sensitized $TiO_2$ nanoparticles, which run into a tradeoff between electron transport resistance (through particle hopping) and exposed surface area, when the film thickness is varied. In addition, most "side-by-side" design structures, which include separate electrochromic and photovoltaic components built upon rigid glass substrates, reduce the overall surface area of the PV. Zinc Oxide (ZnO) is a promising alternative to $TiO_2$ because the film morphology can serve as a direct conduction path for electrons from the point of injection to the collection electrode while maintaining high surface area for absorption. Furthermore, ZnO films are transparent in the visible spectral range, mechanically flexible, and can be produced at low cost. Previous work has been done on ZnO nanowire (NW)-based photovoltaics, and quantum efficiency and energy conversion efficiency of 40% and 1.5%, respectively, have been reported, but this field of research is still at an early stage of development. Evaluation of the energy conversion efficiency of ZnO, as illustrated in FIG. 2A, indicates a theoretical limit of 2.2%, which may be quite suitable for large-area applications. Furthermore, due to its large bandgap (3.34 eV), ZnO and related materials possess the ability to generate a large open circuit voltage (up to 2.8 V, as shown in FIG. 2B), which is very desirable because the switching of electrochromic smart windows is voltage driven. Additionally, since prior approaches on smart windows have focused on the fabrication using rigid substrate materials, use of flexible substrates opens new opportunities.

The economic viability of flexible electronics is enhanced by the advent of fabrication techniques such as printing. Various techniques such as contact printing and direct printing have allowed large-scale integration of films, in particular, through low cost processes, to be directly placed in specific locations. These methodologies include low temperature solution-processed thin films that offer a low thermal budget, and therefore, the promise of being one of the most cost-effective ways to create a large volume of solar cells and many other devices on flexible substrates.

Thus, it remains desirable to achieve self-powered and flexible smart windows via fabrication of a reliable, low cost and reproducible visible-transparent window layer with built-in junctions for harvesting solar energy. These devices are desirably robust (especially when subject to mechanical strain from bending), as well as suitable for large-scale, cost-effective integration for potential commercialization.

Smart windows have received much attention over the years for the potential to be a completely transformative force in reducing energy consumption. Smart windows based on electrochromic techniques allow the variation of transmittance through electrical current, and while the energy required to power and maintain a smart window is typically only about ⅕ the power consumed by a standard nightlight, smart windows account for an even smaller fraction of total windows manufactured worldwide. Part of the small demand is attributed to the fact that the product still represents an extremely niche market. The use of an external power source to operate each window ultimately reduces the freedom of architectural designs. However, a solution to this problem arises from application of principles of the present disclosure: the attachment of a UV solar cell to the smart glass, truly allowing off-the-grid use. While the UV solar cell may (or may not) ultimately power a smart window, the amount of solar energy produced by the UV solar cell may be used to power a variety of other devices. Consider the following: at AM1.5, a power density ($P_d$) of up to about 1000 W/m² is available at sea level. As a conservative estimate, for energy conversion efficiency ($\eta$) of only 1%, a 1 meter by 1 meter window will potentially generate the following power density:

$$P_{d\ 1\ meter \times 1\ meter} = P_d \times \eta$$

1000 W/m²×1%=10 W/m² i.e., a 1 m² window (which is still a relatively small area) can generate 10 W/m². As previously mentioned, since billions of square meters of glass for windows are manufactured worldwide, the potential payoffs for the incorporation of this smart technology are significant.

Additionally, conventional solar cells on windows suffer from aesthetic problems—their cold, bulky feel may be one issue and the fact that they ultimately destroy the very purpose of a window (to see what is outside) is a more pressing issue. Thus, regardless of whether the solar cell is used to power a smart window or simply harvest energy, a UV solar cell is desirably relatively transparent to visible light, so as to retain the optical properties of the smart window. Prior approaches for optically transparent or semi-transparent Si-based photovoltaics have run into a problem of overall size reduction to less than about 100 nm and 60 nm; both indicate that this reduced thickness contributes to electrical shorts from the top contact with the PV, making the fabrication of large area devices extremely difficult. Furthermore, the conventional approaches concentrate fabrication on rigid Si substrates, a material that is already so brittle that with the added thickness constraints, something as simple as weather conditions may cause problems in these devices if no external protection is in use. Thus, the need for a flexible, visible transparent solar cell becomes more imperative. Flexible PVs with the required material characteristics certainly further the freedom of architectural designers. The inclusion of a self-powered stand-alone smart window or solar cell becomes a post-design thought of retrofitting, rather than a burden at the outset. Additionally, the mechanically flexible nature of the device substrate allows for contouring to complex surfaces such as curved windows or even soft fabrics such as a camping tent.

In the large and mature field of silicon photovoltaics, Schottky barrier (or surface barrier) solar cells have had a long historical development, and have reportedly measured cell performances showing comparable $J_{sc}$, $V_{oc}$, and power conversion efficiencies in both simulation and experimental efforts. Metal Semiconductor (MS) Schottky barrier Si-based solar cells were the only choice in photovoltaics up until the early 1950s. This became discarded in favor of homojunction-based solar cells which progressed in lock-step with advances in homojunctions for the microelectronics industry. For example, a MS Si Schottky barrier solar cell that had a power conversion efficiency of 16% was demonstrated; a dramatic improvement over the 6% in MS cells prior to this discovery. Since then, Schottky solar cells have been realized with a variety of all solid-state material systems including GaAs, InAlN, Graphene, $Cu_2O$, CdS, and $SnO_2$.

Schottky barrier photovoltaics have retained interest for a number of reasons, including the fact that they are usually fabricated with fewer processing steps, and therefore, cost less than a typical homojunction solar cell. As is well understood, a similar barrier forms when a metal (Ag or Au) of high work function contacts a high band gap semiconductor such as ZnO. Under illumination of this contact with photons of higher energy than the semiconductor band edge, carriers generated at the surface diffuse into the semiconductor, where electrons and holes are separated by the field within the depletion layer. Band bending between the metal and semiconductor reduces with the application of forward bias, thereby shifting the state of the device to an open-circuit condition; here, the recombination rate is equal to the generation rate. Historically, Schottky barrier devices have had their own set of challenges including improper formation of a barrier afterprocess treatment, as well as a number of other loss mechanisms that occur at the surface. Many reports have discussed the importance of surface passivation and a thin insulation layer.

Figure 4:
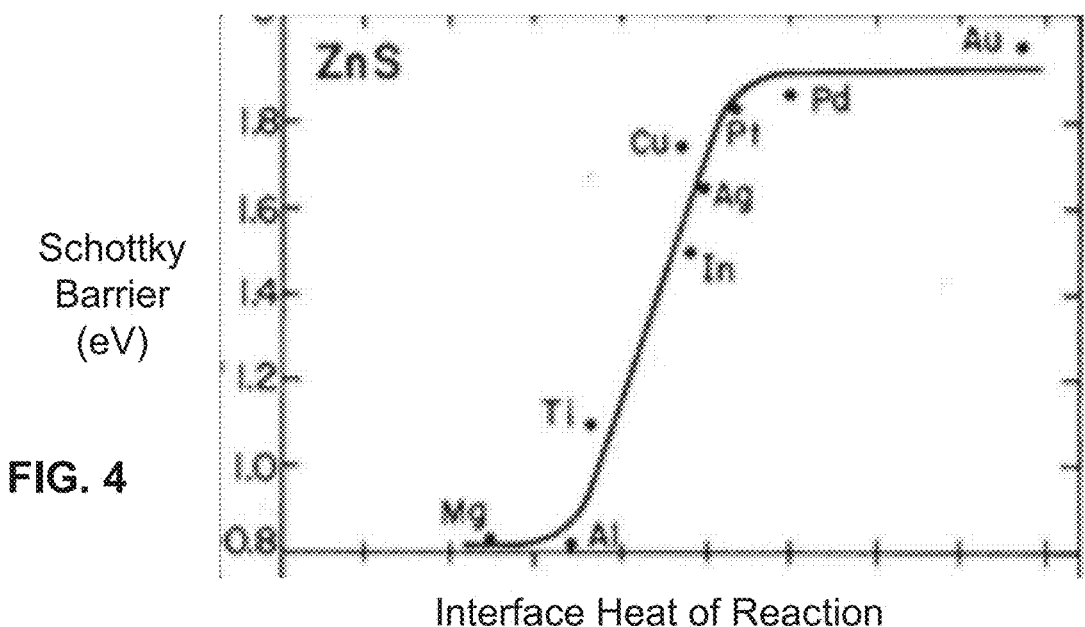
FIG. 4 illustrates calculated Schottky barrier height for various metals on ZnS in accordance with an exemplary embodiment.

Voltage-tunable light transmission characteristics of switching, inorganic electrochromic devices utilize a high drive voltage (>2 V), and for autonomous systems, a simple architecture of the power supply module is also important. Therefore, single metal-semiconductor junction devices that convert ultraviolet (UV) photon energy into high open circuit voltage ($V_{oc}$) are highly desirable. At 300 K, the highest reported Schottky-barrier height for Pt—ZnO contact is 0.75 V, whereas barrier heights of ZnS (sphalerite)-Au and ZnS (sphalerite)-Cu contacts are found to be as high as 2.00 V and 1.75 V, respectively, as shown in FIG. 4. ZnS is a wide band gap semiconductor material that exists in two different polymorphs, namely zinc Blende (or Sphalerite) and Wurtzite. The former, with a band gap of ≈3.72 eV, is the stable phase at room temperature (T), whereas the high temperature Wurtzite exhibits a band gap of ≈3.77 eV. Moreover, since kinetics and presence of impurities, such as oxygen in ZnS, play roles in promoting the metastable formation of Wurtzite, control of the oxygen ion activity during low-temperature growth of ZnO may facilitate the formation of Wurtzite. Note, although the limited flux of photons in the sunlight spectrum may be detrimental for conventional photovoltaic devices, the specific requirement of electrochromic devices makes the abundant and environmentally-friendly ZnS and ZnO compositions rather appealing. Principles of the present disclosure disclose that ZnS can be grown on ZnO films with high quality. The high barrier heights for novel ZnS/ZnO heterojunctions translate to much higher $V_{oc}$ than either ZnO-based or ZnS-based (films and nanowires) Schottky contacts.

Figure 5:
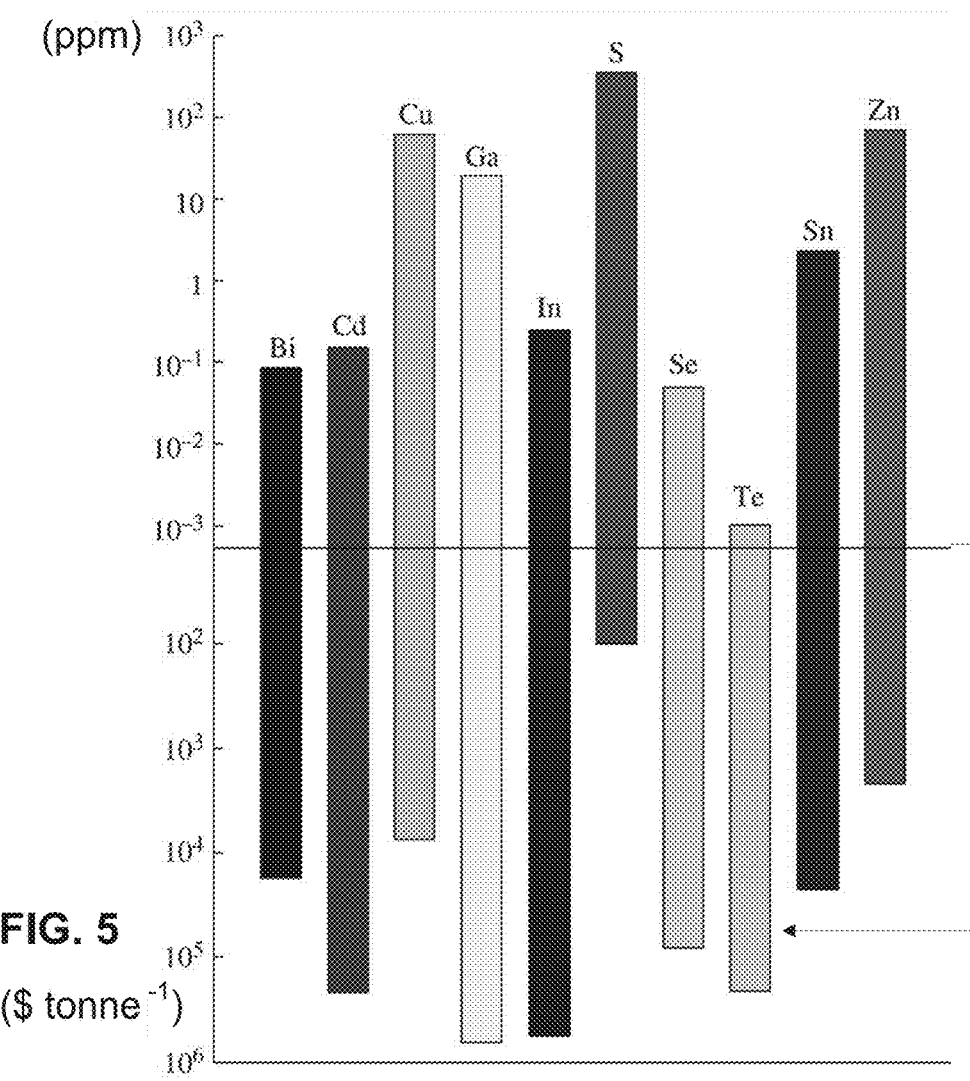
FIG. 5 illustrates availability and cost information for various materials utilized in exemplary systems in accordance with an exemplary embodiment.
Figure 6:
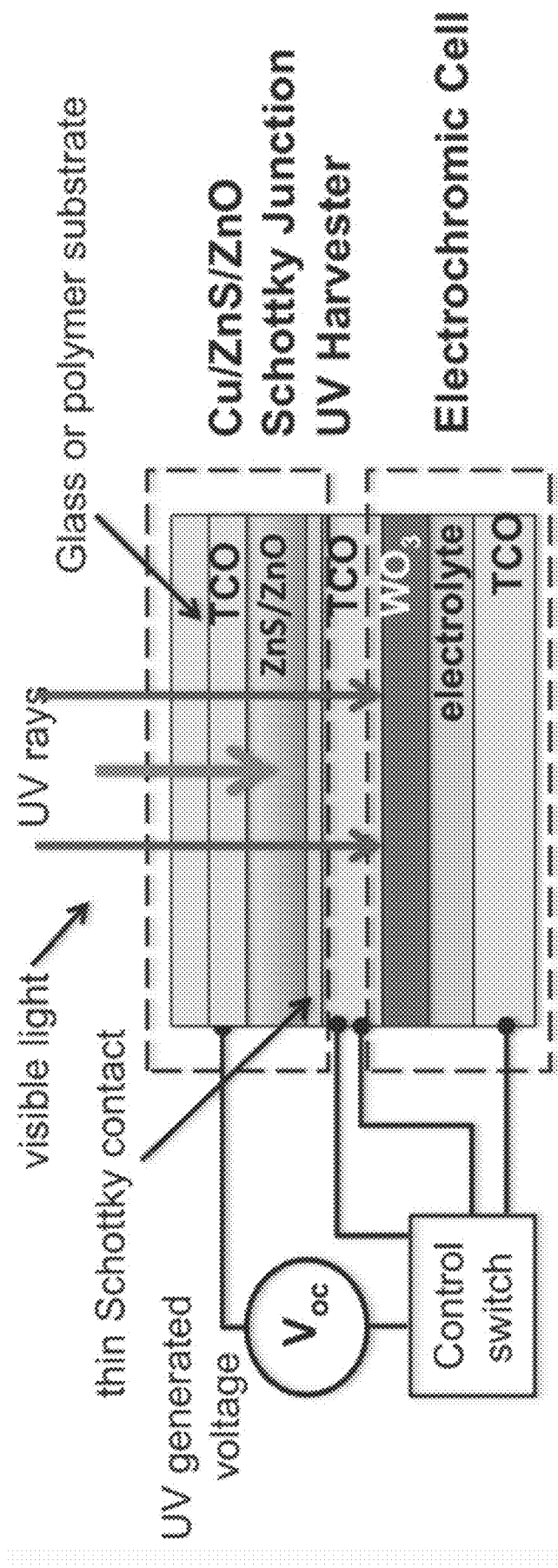
FIG. 6 illustrates structure of an exemplary system incorporating electrochromic and photovoltaic components in accordance with an exemplary embodiment.
Figure 7:
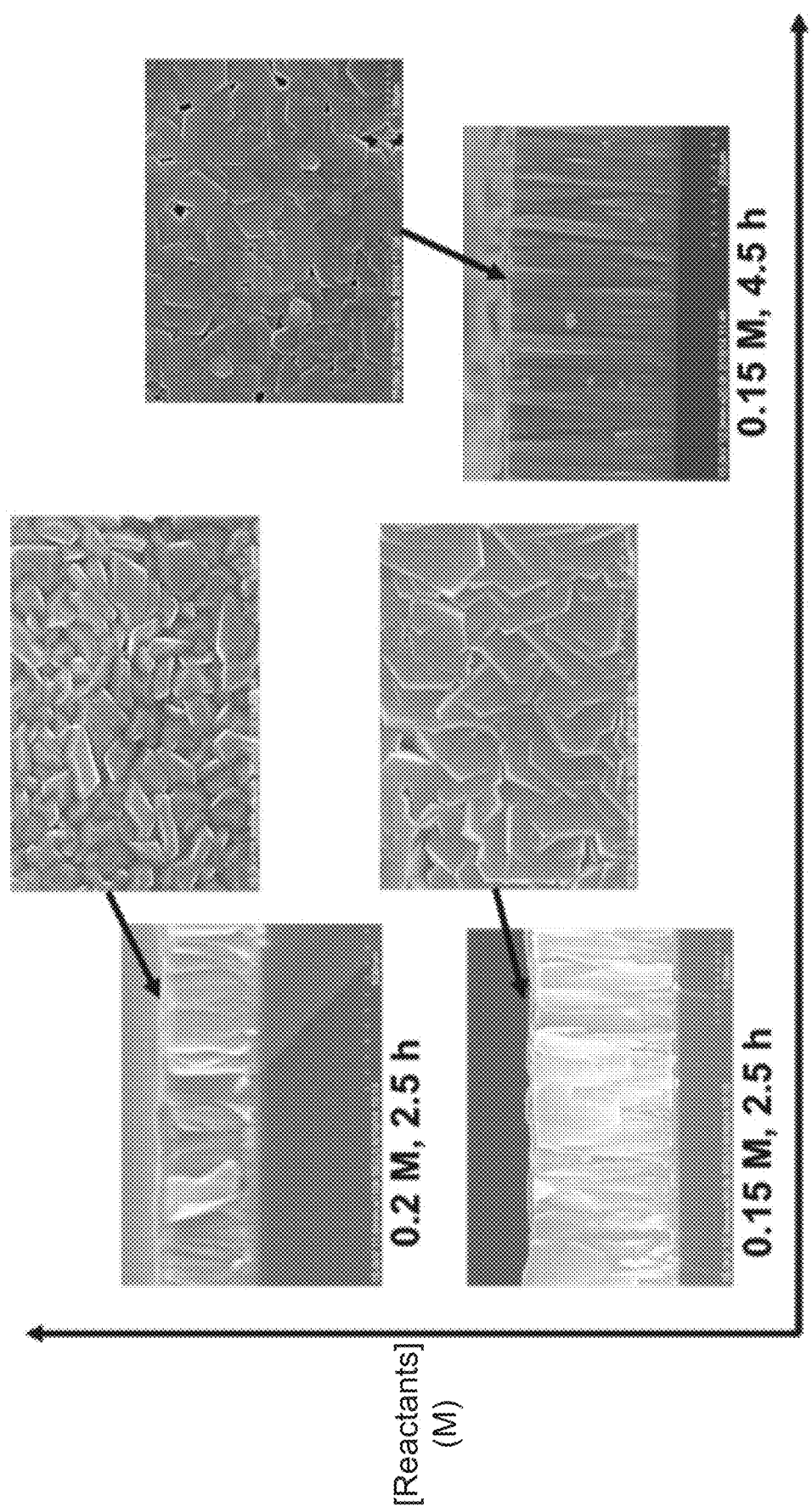
FIG. 7 illustrates scanning electron microscope (SEM) views of ZnO thin films in accordance with an exemplary embodiment.

In order to make a significant contribution to satisfy global energy requirements, issues of sustainability and cost, including materials abundance and cost of extracting those materials, and cost of processing methods, are important. As can be seen in FIG. 5, the energy-material elements of Cu, Zn and S are among the most abundant in the Earth's crust and have the lowest costs. Therefore, in various exemplary embodiments, through use of these materials coupled with solution deposition, monolithic integration of Cu/ZnS/ZnO photovoltaic cells onto electrochromic stacks may be achieved using a flexible polymer as the substrate. As illustrated in FIG. 6 and further disclosed in various exemplary embodiments, the characteristics of the materials, devices, and hybrid photo-electrochromic system are presented.

Figure 8:
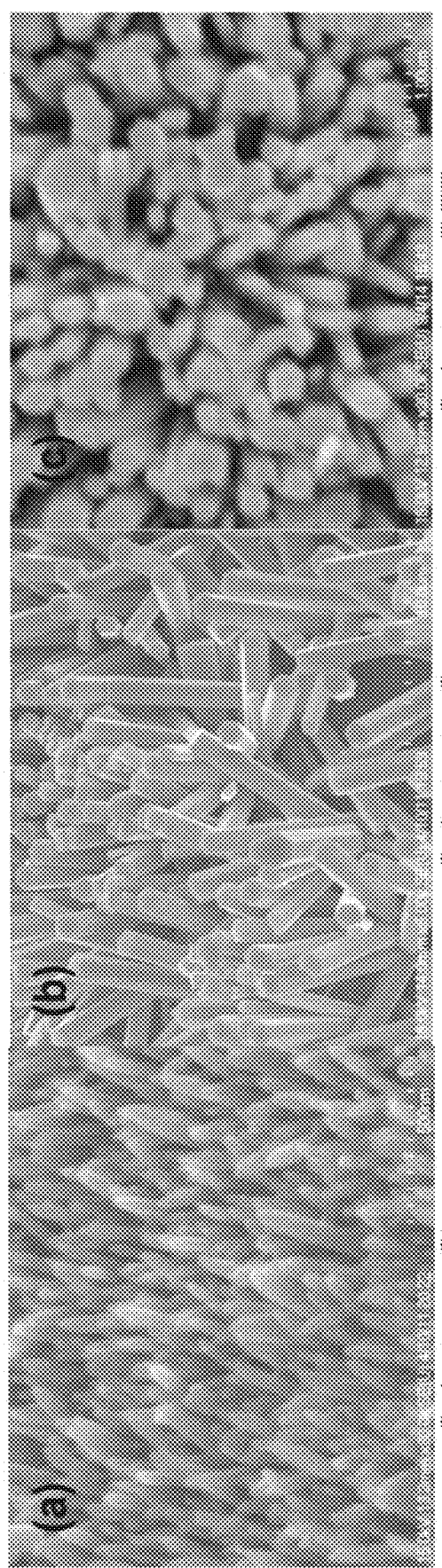
FIG. 8 illustrates SEM views of ZnO structures in accordance with an exemplary embodiment.
Figure 9:
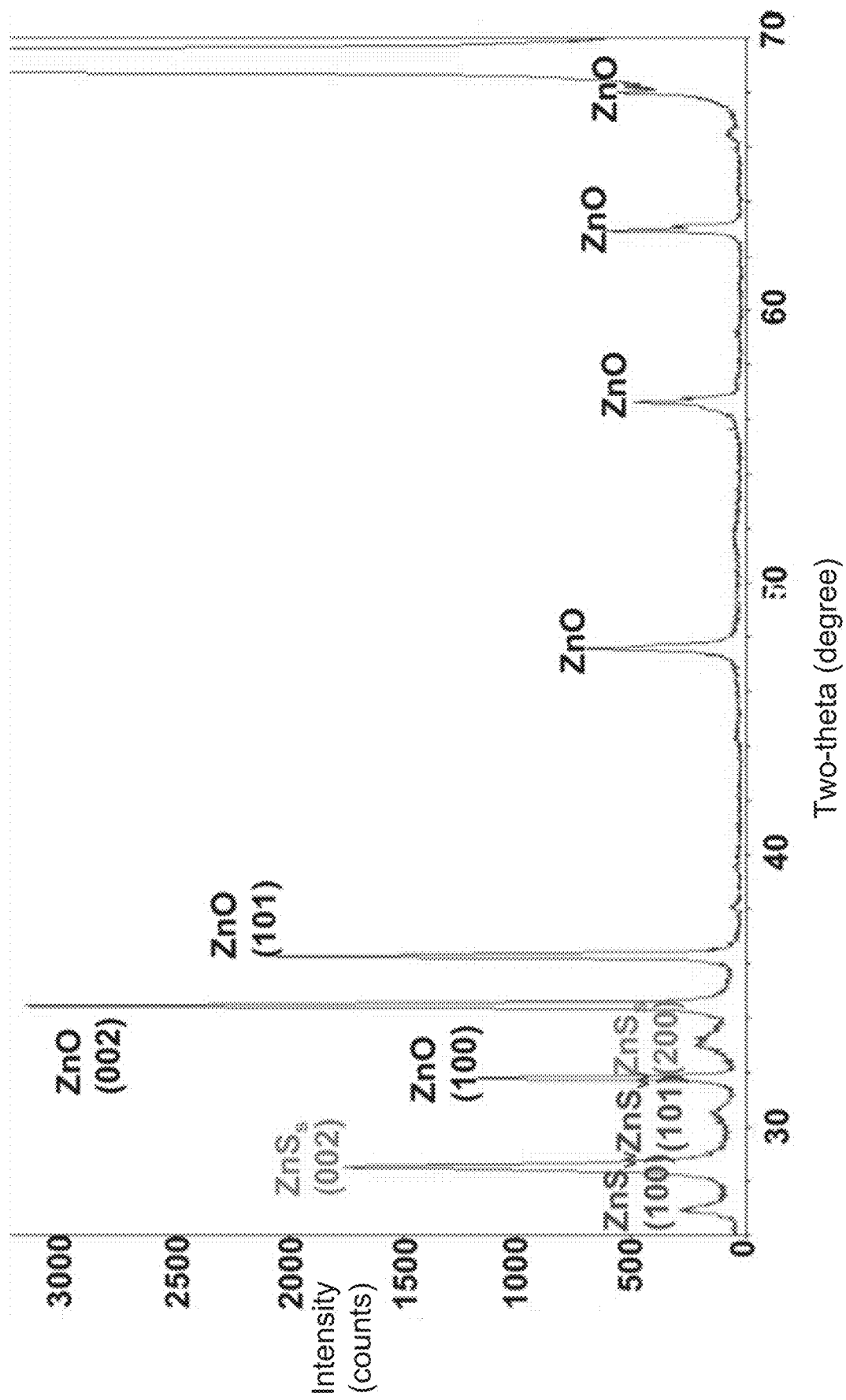
FIG. 9 illustrates x-ray diffraction patterns of ZnO thin film after sulfurization to partially convert ZnO film to ZnS in accordance with an exemplary embodiment.

In accordance with various exemplary embodiments, nanostructures of undoped ZnO (i.e., thin films and nanowires) may be grown on ZnO-seeded silicon substrate using a solution growth technique. A 10 nm thick, sputtered ZnO seed layer on highly doped n-Si substrate exhibits conductivity comparable to the bare substrate. The chemical bath may comprise an aqueous solution of Zinc Nitrate ($Zn(NO_3)_2$) and hexamethylenetetramine (HMTA). The interrelationship between the effects of the reactant concentration and growth time on the resulting ZnO nanostructure is summarized in FIG. 7. The typical growth temperature can be controlled between 80-100° C. in aqueous solution. FIG. 8 illustrates SEM images ZnO vertical pillars grown on ZnO seeded rigid Si substrate using a solution technique with different concentrations of 0.01 M and 0.1M, respectively. It indicates the size and length of the ZnO pillars can be controlled by the solution concentration. FIG. 8 also illustrates a SEM image illustrating the growth of ZnO vertical pillars on ZnO seeded polymer substrate polyethylene terephthalate (PET), highlighting the capability to grow ZnO on polymer substrates.

In accordance with an exemplary embodiment, partial conversion of ZnO materials into ZnS nanomaterials may be achieved by sulfurization under $H_2S$ gaseous atmosphere at about 400° C. In various exemplary embodiments, ZnO/ZnS film is synthesized using this approach, as shown in an XRD plot in FIG. 9, where diffraction peaks from ZnO and ZnS can be seen clearly. This strategy is extendable to ZnO films prepared through various techniques, such as CBD and VLS to evaluate the sulfurization process and optimal conditions.

Figure 10:
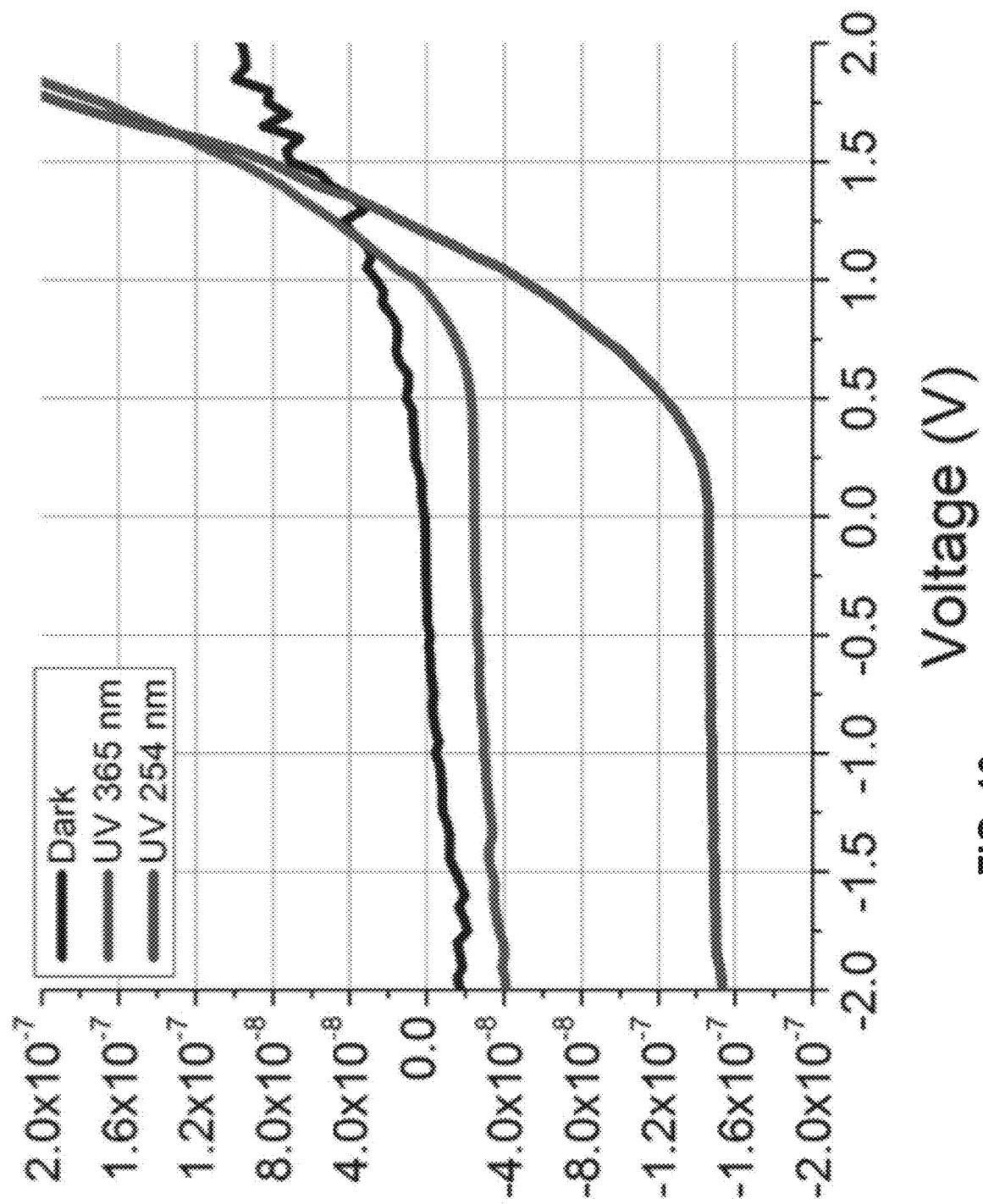
FIG. 10 illustrates current-voltage curves for an Ag on ZnO film metal-Schottky diode in accordance with an exemplary embodiment.
Figure 11B:
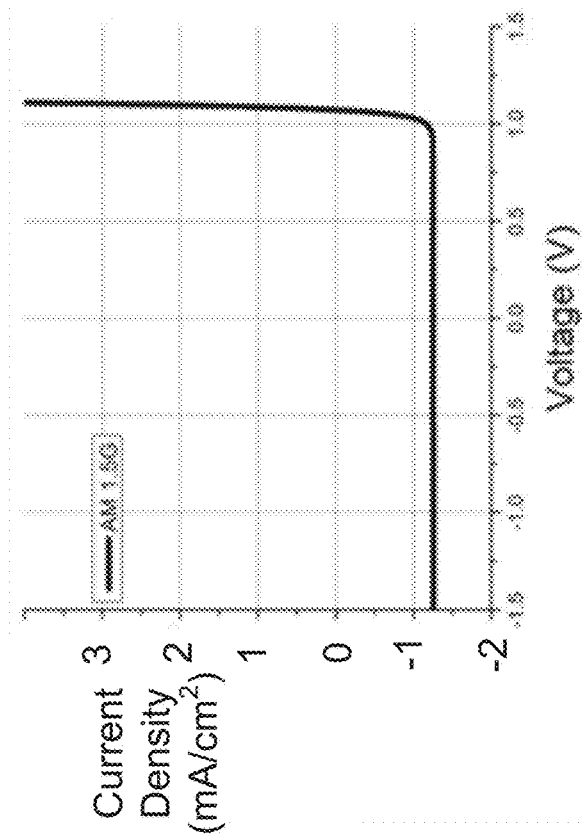
FIGS. 11A and 11B illustrate simulated behavior of an exemplary Schottky solar device in accordance with an exemplary embodiment.
Figure 11A:
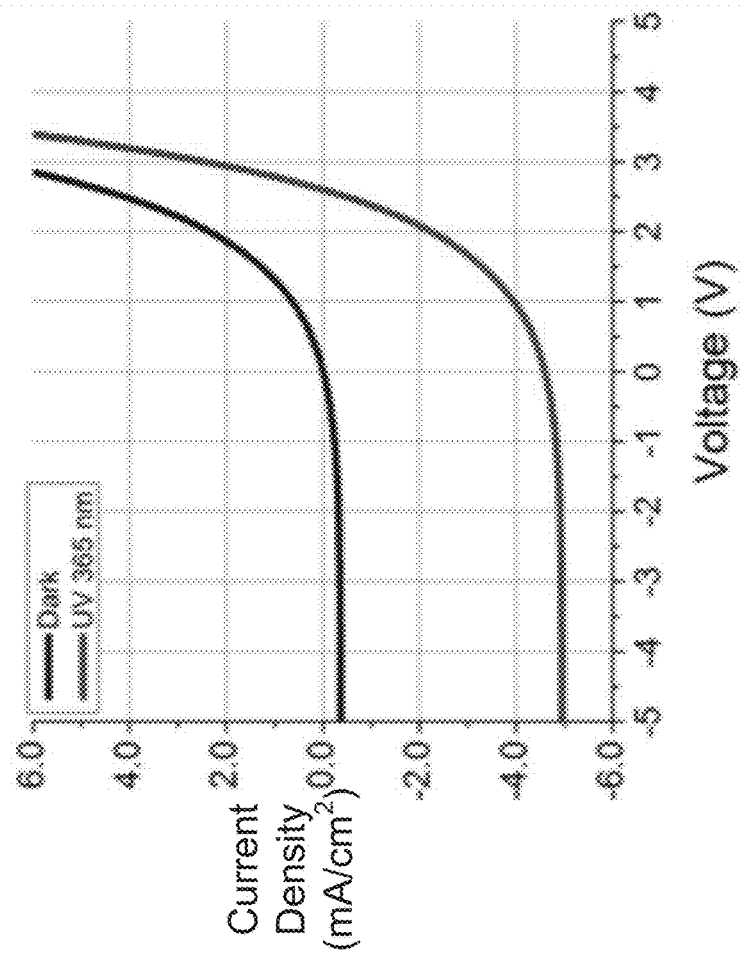

In an exemplary embodiment, as a first step of verification of large open circuit voltage Schottky diode solar cell on large band gap material, a ZnO Schottky diode may be fabricated. ZnO thin films may be deposited on both Silicon and $SiO_2$/ITO microslides, for example using a RF Magnetron sputtering system. Approximately 1 μm of ZnO may be deposited across each set of devices and this active layer thickness may be established and optimized with absorption depth analysis. Photovoltaic industry-standard grid patterns may be utilized to optimize carrier collection on the entire illuminated surface. In order to increase short circuit current, a greater area is desirable to be utilized to facilitate carrier collection, after generation, without recombination effects dominating this process. A grid device pattern of Ag may be deposited on the ZnO film and compared to with the Ag dot device structures. Current-voltage curves for Ag on ZnO film metal-Schottky diode under dark condition and under 365 and 254 nm UV exposure, show open circuit voltage of up to 1.2 V (as shown in FIG. 10), a voltage close to the value to start driving electrochromic thin film to change its transmittance. However, in order to be able to change color, or the transmittance even further for practical applications, an even larger open circuit voltage is desired, such as 2V.

Principles of the present disclosure contemplate the capabilities of ZnO as an absorber; exemplary device systems may be modeled as a perfect Schottky barrier exposed to a constant power illumination directly at the band-edge wavelength of ZnO. In various exemplary embodiments, the analytical expression for the total current ($J_{total}$) is given by:

$$J_{total} = J_L - J_f$$

$$J_f = \left\{ \left[ \frac{4\pi e m_{n*} k^2}{h^3} \right] T^2 e^{\frac{-q\Phi_{bn}}{kT}} \right\} \left\{ e^{\frac{qV_a}{kT}} - 1 \right\}$$

where, $J_L$ is the reverse bias illuminated current density, and $J_f$ is the forward bias Schottky diode current density. The results verify the limits of the photovoltaic effect in ZnO, and confirm that ZnO alone, as an absorber exhibiting the right barrier height, has the capability to provide the necessary power output for an electrochromic stack.

A numerical simulation may also be utilized, for example one initiated in the PC 1D solar simulation package. Using material parameters obtained from the literature, and considerations of the effects of impurity concentrations and recombination densities, a realistic device simulation is featured in FIG. 11B. Here, an open circuit voltage of 1.16 V and a short current density of 10.40 mA/cm² and a power conversion efficiency of 11.83% are realistically modeled for an exemplary device.

In an exemplary embodiment, a heavily phosphorous-doped n-Si wafer is usable as the substrate. A Mn-doped ZnO thin film (1 μm) may be sputtered using a plasma-assisted sputter deposition technique. The wafer may be sealed into $H_2S$ atmosphere, and ZnO is partially converted to ZnS at about 350° C. for about 1 hour. The resultant wafer may be further processed using photolithography to deposit an interdigitated pattern of chrome (Cr)-Gold (Au) to form the Schottky contact. The entire procedure can be described in several important steps: hex amethyldisilazane (HMDS) spin coating, photoresist spin coating, photolithography using an interdigital mask, and finishing with Cr—Au metal deposition using thermal evaporation. The electrical and the photovoltaic properties of the resultant sputtered ZnO thin film on n-Si substrate and the solar cell device may be tested, for example by I-V measurements under dark, and UV-illuminated conditions.

Figure 12A:
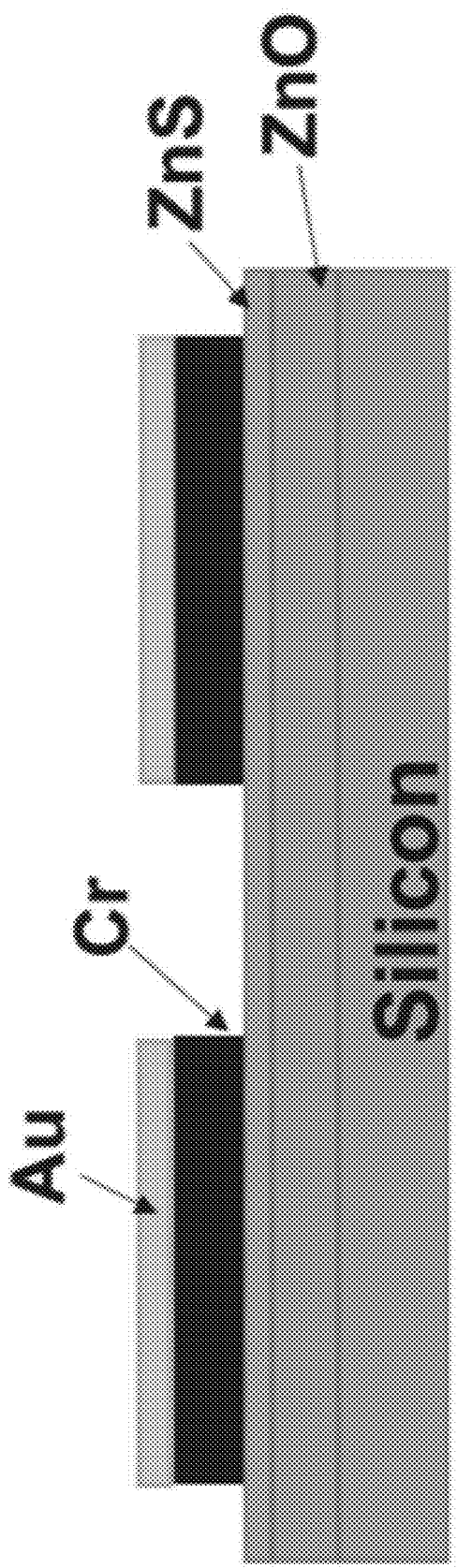
FIGS. 12A and 12B illustrate device configuration of a Schottky contact formed by depositing an interdigital pattern of Cr—Au onto a ZnO—ZnS heterojunction in accordance with an exemplary embodiment.
Figure 12B:
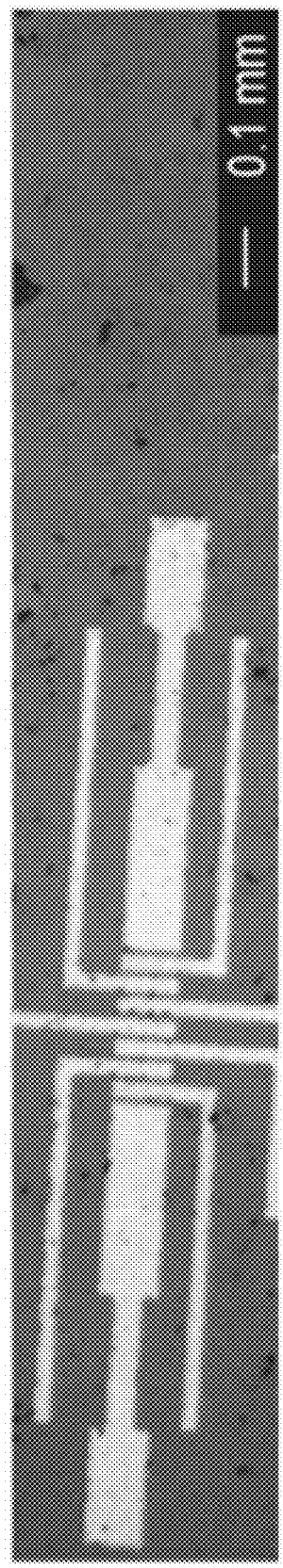

An exemplary device configuration is shown in FIG. 12A. In various exemplary embodiments, Cr/Au contacts the ZnS layer on sputtered ZnO thin film/Si substrate. The metal pattern, shown in FIG. 12B, is configured for light to reach the photon-absorbing region, i.e., a Schottky ZnO/ZnS heterojunction. The corresponding energy diagram of the device is similar to the one illustrated in FIG. 3.

Figure 13:
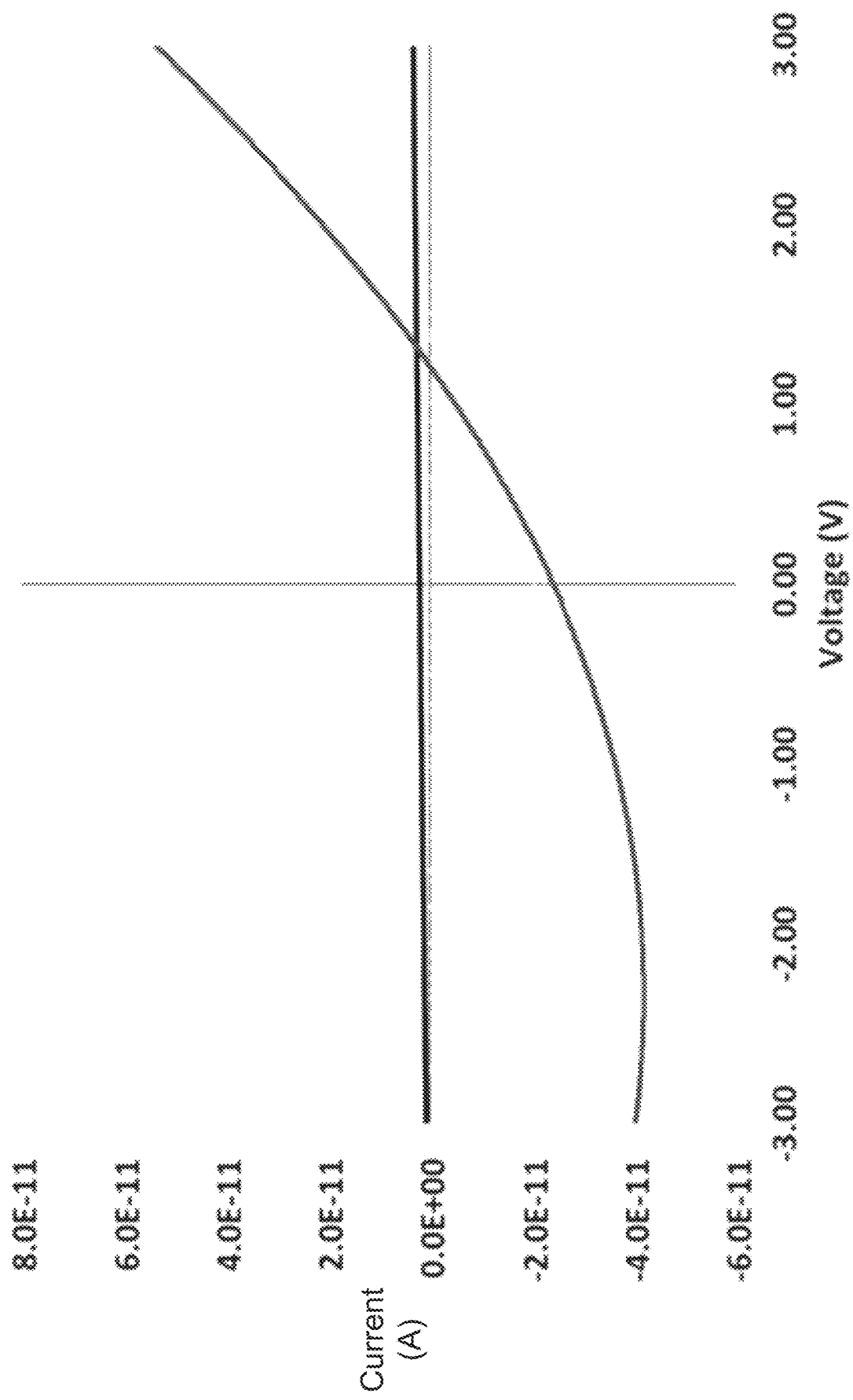
FIG. 13 illustrates current-voltage curves for an exemplary device illuminated with UV light having a wavelength of 302 nm in accordance with an exemplary embodiment.

The I-V measurements demonstrate suitable operation of a Schottky heterojunction; the $V_{oc}$ was about 1.35 V. However, as shown in FIG. 13, the $J_{sc}$ was very low since the sputtering target, consisting of Mn-doped ZnO, rendered the ZnO thin film fairly insulating. Therefore, in order to fabricate low cost, high $V_{oc}$, UV-absorbing solar cells, principles of the present disclosure also contemplate solution grown ZnO as the core material.

Principles of the present disclosure integrate visible wavelength-transparent, UV-absorbing and voltage generating photovoltaic (PV) devices, comprised of Metal-ZnS/ZnO Schottky junctions, onto a well-established electrochromic stack to demonstrate autonomous (or self-powered) photo-electrochromic systems at low cost on glass and/or polymer-based substrates. The advantages of wet chemical processing over vacuum techniques include compositional control, low cost, and capacity for producing materials on large areas. Exemplary embodiments demonstrate controllability on the solution synthesis of ZnO and ZnS on several substrates (i.e., Si, PET, glass, and the like). Moreover, since the PV device operates in the ultraviolet (UV) region with relatively low photovoltaic power conversion efficiency in comparison to conventional solar cells, the important metric here will be the open circuit voltage ($V_{OC}$) and power to drive the electrochromic stack.

In various exemplary embodiments, exemplary devices and systems may be created and characterized, as follows: 1) Synthesize ZnO thin films by a low temperature, low cost solution deposition technique. 2) Partially convert the ZnO to ZnS in a sulfurizing environment to form the ZnO/ZnS heterojunction. The conversion may be monitored by surface analytical and electron microscopic techniques, in order to account for the multiple defect equilibria, dopant compensations, and partial pressure and temperature dependences for process and product reliability and reproducibility. 3) Fabricate device structures via the use of metals on ZnS/ZnO heterojunction. In various exemplary embodiments, ultrathin metallic contacts (M=Cu, Au, Pd, and Pt), of the order of 1-10 nanometers, on such heterojunctions devices may be used to determine the photovoltaic and optical properties. 4) Characterize the materials and devices in each step of the processing and fabrication cycles. Desirable metrics here include high open circuit voltage, low dark current, and high photocurrent. 5) Integrate the PV ZnS/ZnO film photovoltaic devices onto available electrochromic stacks and test the photo-electrochromic system for its efficacy. Specifically, this hybrid, monolithically-integrated system may be characterized for transparency and switching times and self-powering capability.

In various exemplary embodiments, ZnO nanomaterials (i.e. thin film and nanowires) are grown on various ZnO seeded substrates (i.e. glass, silicon and PET substrate) using a solution growth technique. The morphology may be controlled through the concentrations of the precursors in the bath and the growth time. The resulting nanostructures are annealed in $H_2S$ atmosphere to form the ZnO/ZnS heterojunction. In order to gain control of extent of conversion, nanostructure, and phase evolution, the ZnO/ZnS conversion process may be optimized using the founding principles for the determination of processing-nanostructure-property relationships via:

(a) Determination of the mildest reaction environment, i.e., annealing temperature, partial pressure of $H_2S$ and $O_2$ in two-step annealing atmospheres, and rapid thermal annealing duration using statistical design of experiments. The partial conversion of ZnO to ZnS may be carried by sulfurization under $H_2S$ gaseous atmosphere at about 400° C. Additionally, for a low-cost, low-temperature approach, use of various sulfur containing solutions, such as $NH_4S$ and $Na_2S$, may be implemented.

(b) Utilization of materials characterization techniques including x-ray diffraction, scanning and transmission electron microscopy, optical absorption, photoluminescence, cathodoluminescence, photovoltaic I-V response to monitor the evolution of the crystalline phase, general morphology, interface quality and property of the ZnS/ZnO heterojunctions.

Reliable and reproducible processes for the synthesis of ZnO films and ZnO/ZnS heterojunctions are disclosed herein. The initial solution processing parameters include the concentration of Zn precursor, growth time, and solution temperature, and for the ZnO to ZnS conversion process, time, sulfur activity, and temperature. For both ZnO thin films and formation of ZnO/ZnO heterojunctions, an exemplary optimization approach consists of three stages; (i) screening with all parameters, (ii) a full factorial or fractional factorial (with main effects and interaction effects using coded parameters), and (iii) determination of the responses' surface curvature. The appropriate responses may be selected from data of x-ray diffraction, electrical and optical characterization, photoluminescence, cathodoluminescence, photovoltaic response, device simulations, and/or the like. To determine the response surfaces, a second-order regression model expresses the effects of quadratic and interaction terms in the response polynomial as follows:

$$y = \beta_0 + \sum_{i=1}^{k} \beta_i x_i + \sum_{i=1}^{k} \beta_{ij} x_i^2 + \sum_{i<j} \sum \beta_{ij} x_i x_j + \varepsilon$$

where j's are the number of parameters, x's are coded parameters representing the natural variables, β's are regression coefficients, and ε is a random error term. In order to fit this model, additional experiments including center points, i.e., a central composite design (CCD) may be performed. The analyses of the resulting response surface plot, in terms of the process parameters, may determine the optimum processing conditions.

In various exemplary embodiments, fabrication of ultrathin metallic contacts (M=Cu, Au, Pd, and Pt), of the order of 1-10 nanometers, is performed on such heterojunctions devices to determine the photovoltaic and optical properties.

In various exemplary embodiments, after ZnS/ZnO films are synthesized and deposited on appropriate substrates, a series of fabrication steps is undertaken to complete the device structures. Three main components to fabrication include 1) surface treatments prior to processing, 2) device patterning, and 3) metallization.

Surface treatments (1) and preparation strategies for ZnO have largely been expounded on, and have ranged from cleaning techniques, oxygen plasma, and ozone-based treatments. One strategy that has not received much attention in terms of creating Schottky-based solar cells for oxide-based material systems is surface passivation and formation of an ultrathin insulating layer to serve as an electron blocking layer. Patterning considerations (2) had been optimized to create a grid structure that best exposed the right amount of area for carrier generation and shaded the right area for collection. Metallization (3) is carried out on a combination of thermal and electron-beam evaporators, of which source materials of known reported large Schottky barrier heights (Cu, Au, Pd, and Pt) may be deposited.

In various exemplary embodiments, it is desirable to closely monitor the materials and Schottky diode property in each step of the processing and fabrication cycles, starting from ZnO synthesis, partial conversion to ZnS and Schottky contact formation, to ensure high open circuit voltage, low dark current, and high photocurrent. The impediments to achieving these metrics are mainly defects in the film. Both optical and electrical characterization techniques are useable for this purpose.

Figure 14:
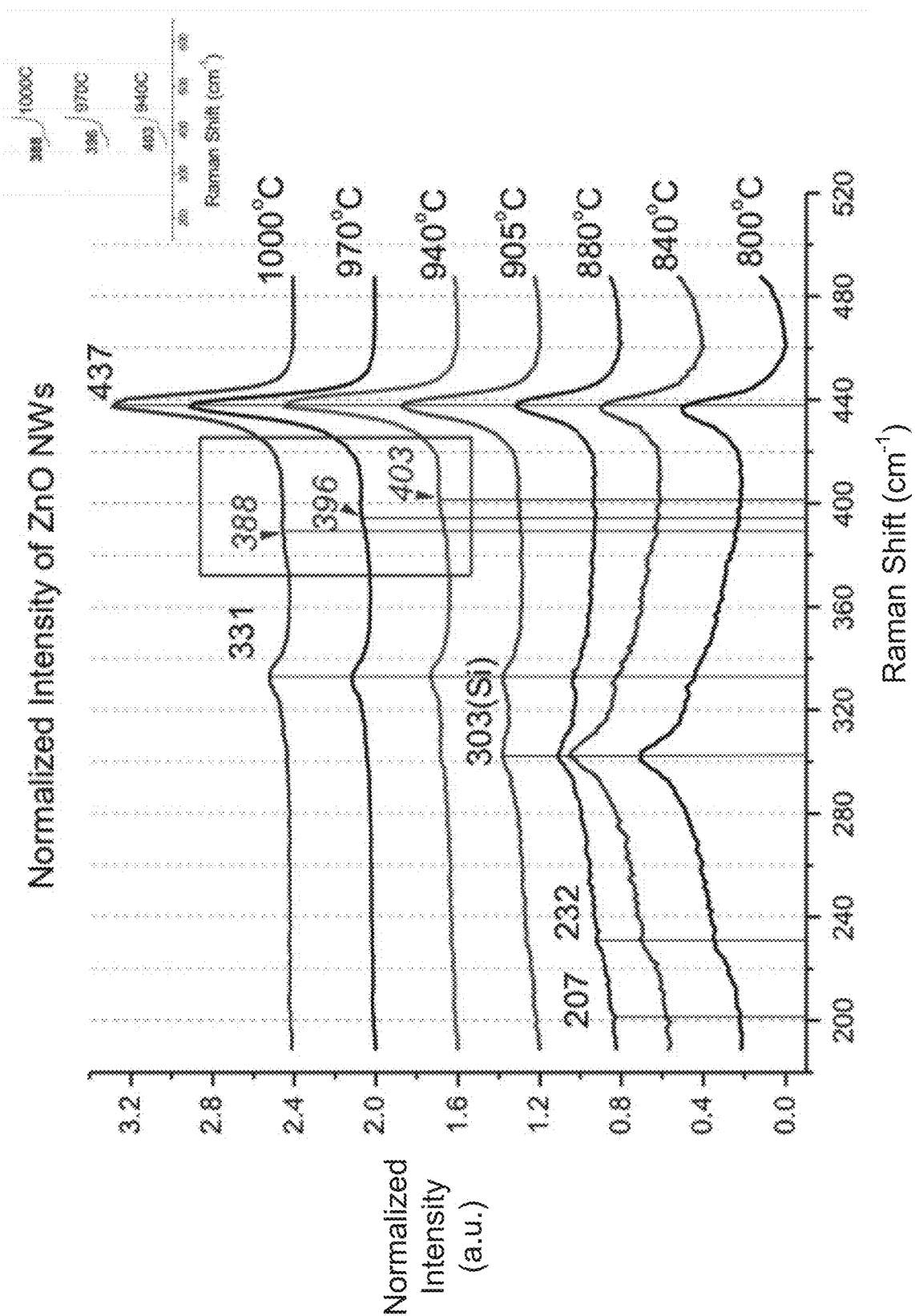
FIG. 14 illustrates a series of Raman spectra of ZnO nanowires grown at different temperatures indicating peak shift due to different morphology in accordance with an exemplary embodiment.

In various exemplary embodiments, optical analysis techniques are usable to understand the quality of the ZnS/ZnO films. ZnO belongs to the space group $C^4_{6V}$. Here A1 and E1 are polar modes and are both Raman and infrared active, whereas the two E2 modes (involving mainly Zn motion and characteristic of the wurtzite phase) are nonpolar and Raman active only. Both A1 and E1 split into transverse (TO) and longitudinal optical (LO) phonons. Therefore, Raman spectra for the ZnO films may be recorded in the 10-1200 cm$^{-1}$ spectral range. Several common low-frequency features are assigned to the second order Raman spectrum arising from zone boundary phonons $3E_{2H}$-$E_{2L}$, $A_{1T}$, and the envelope of bands above 1095 cm$^{-1}$ attributed to overtones and/or combination bands. The peaks of ZnO at 331, 388, 436, and 584 cm-1 are assigned to $E_{2H}$-$E_{2L}$, $A_{1T}$, $E_{2H}$, and $E_{1L}$ of bulk ZnO, respectively. Since the $E_{2H}$ mode involves only oxygen atoms and the $E_{1L}$ mode is associated with oxygen deficiency, a strong $E_2$ mode and a low $E_1$ mode would be indicative of a lower oxygen vacancy density and films of high quality; its intensity has been observed to depend on crystallinity, crystal orientation, and on the synthesis method. If $E_{2H}$ mode of ZnO films is shifted toward lower frequency by a small amount (1 cm$^{-1}$), it will be attributed to strains and defects, as illustrated in FIG. 14.

In various exemplary embodiments, exemplary devices may be characterized via deep level transient spectroscopy (DLTS) and electron beam induced current (EBIC), after Schottky contacts are fabricated. However, any suitable characterization approach and/or devices may be utilized.

DLTS is a powerful tool that is often used to measure the relative density of trap states in the active material. Trap states represent recombination centers which translate to reduced performance. DLTS can uncover systematic issues with bulk material and strategies can be undertaken afterwards to reduce the concentration of trap states.

Figure 15:
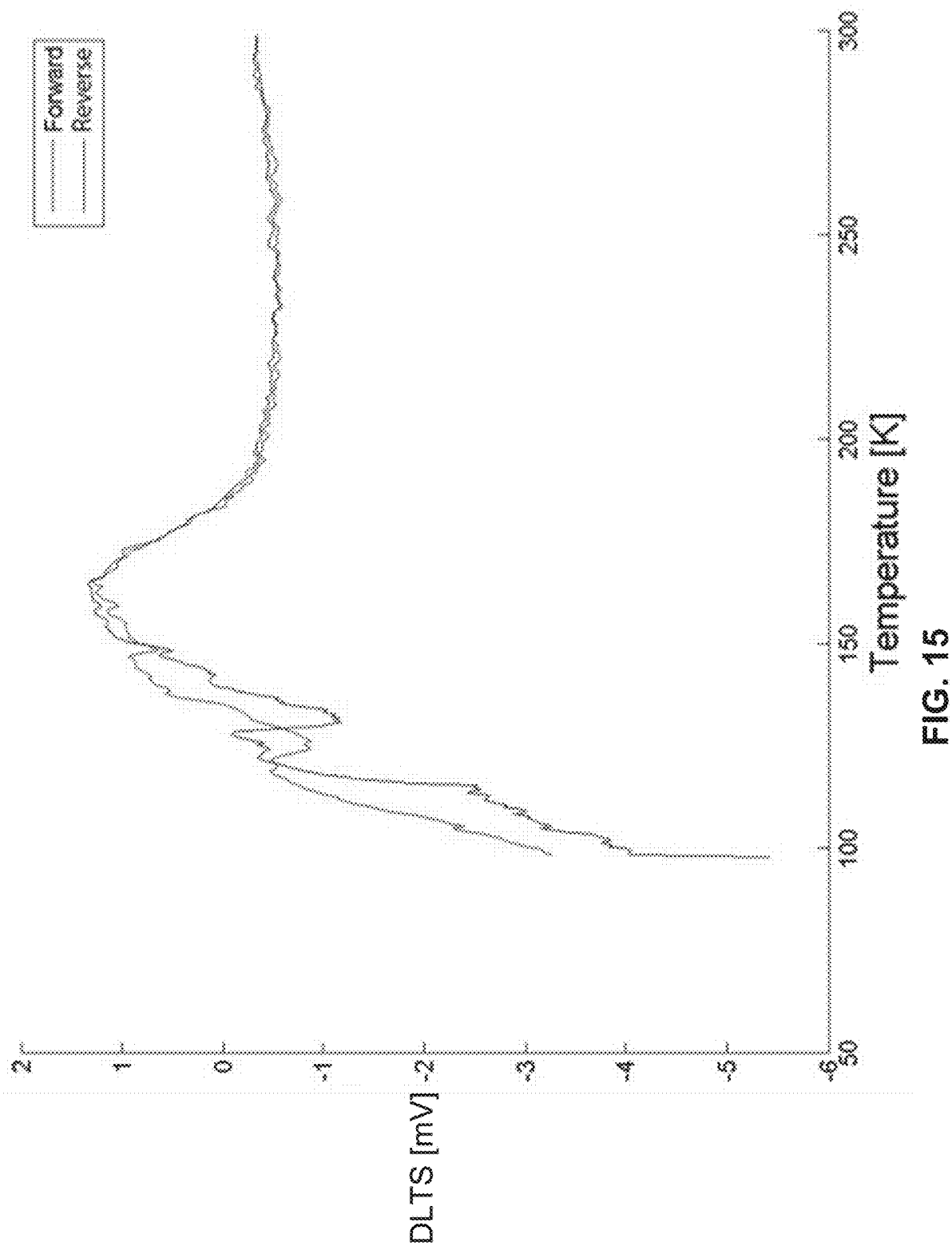
FIG. 15 illustrates DLTS spectrum of sputtered Mn—ZnO thin film in accordance with an exemplary embodiment.

To gain further understanding of the ZnO thin-film device, as well as for future considerations of relevant information in a DFT model of a ZnO device, preliminary DLTS measurements may be carried out. In this manner, one can identify active defects, such as traps, that lead to the formation of recombination centers, and to reconcile why performance and yield may be low. FIG. 15 illustrates a DLTS spectrum of an exemplary device. A transition peak is observed at approximately 170 K, which has been reported to be linked to the presence of Mn, as the sputtering target contains a small amount of Mn. The spectrum also exhibits a peak at approximately 120 K, which has been assessed from Arrhenius plots of existing literature. Therefore, further studies on the frequency and temperature dependences of the DLTS signal are warranted so that a deeper understanding of why the photovoltaic responses of the Mn—ZnO cells have been markedly inconsistent. Moreover, by unambiguously identifying the source of these defect peaks, coupled with DFT modeling, controlled experiments can be designed and implemented to improve the performances of these devices. DLTS may be used on solution deposited thin films to identify likely defects in the film and in turn, the result optimizes the solution synthesis to reduce or eliminate the defects thus improve the film quality that would lead to large open circuit voltage.

EBIC:

Induced current based measurements can better inform device performance under low levels of injected carrier densities, comparable to that of solar irradiation. Varying injection density can elucidate a number of factors in the exemplary material system disclosed herein, including grain boundaries at the threshold of beam current as well as images to get an illuminated sense of majority carrier distribution along the film. Additionally, identification of various types of shunt have been reported and identified through EBIC measurements for crystalline Si based solar cells. Works on CdTe solar cells have also made great use of EBIC to spatially resolve and map grain boundaries for improved device performance.

Figure 16B:
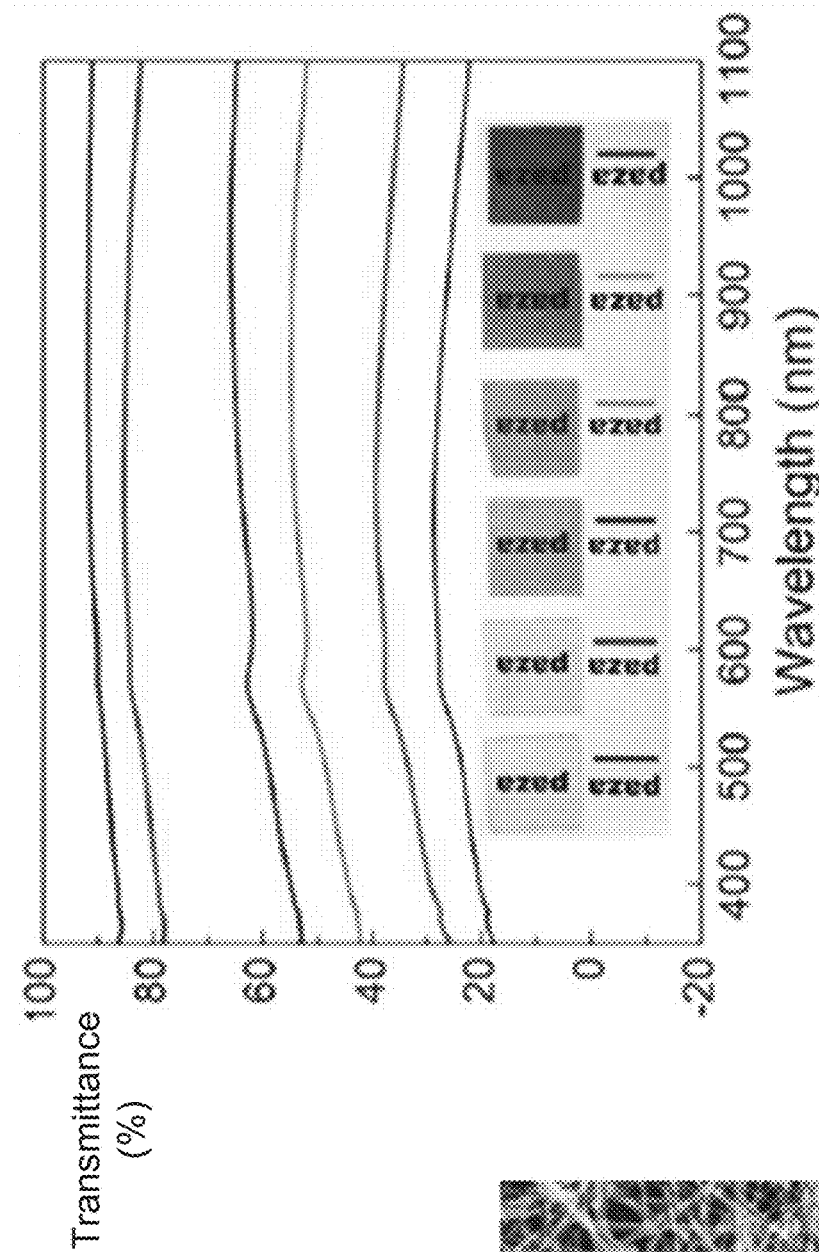
FIG. 16B illustrates UV-vis-NIR transmission spectra for CU nanowires of various concentrations in accordance with an exemplary embodiment.
Figure 16A:
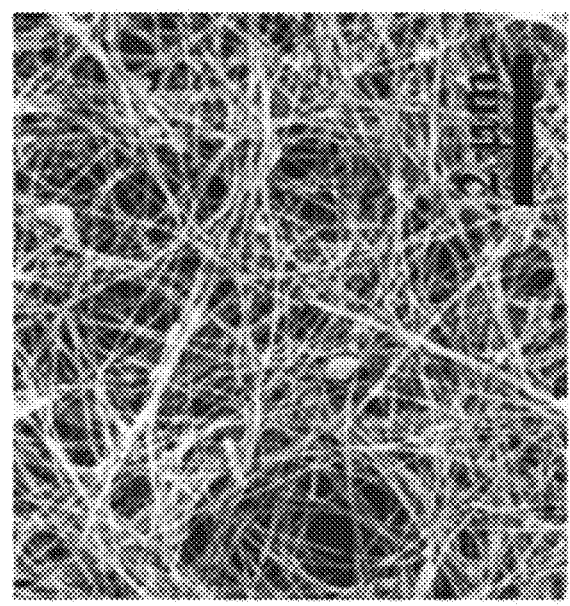
FIG. 16A illustrates SEM images of solution-grown Cu nanowires in accordance with an exemplary embodiment.
Figure 16C:
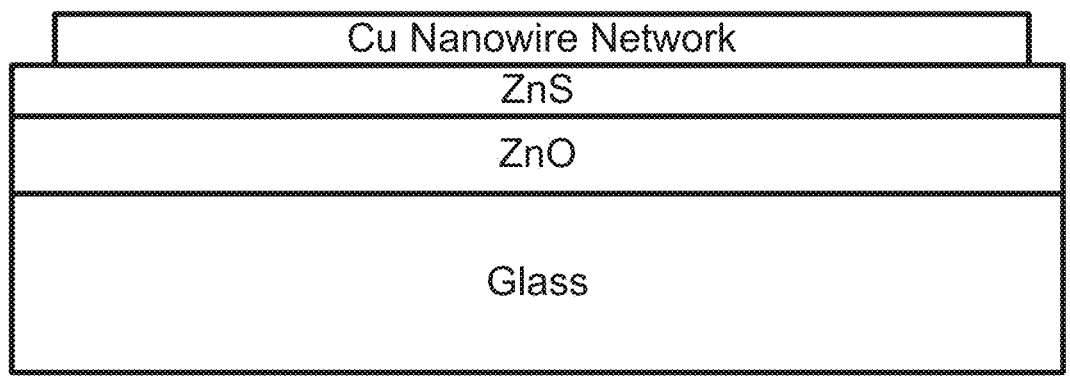
FIG. 16C illustrates an exemplary device incorporating a Schottky contact formed by percolating Cu nanowire network into a ZnS/ZnO heterojunction in accordance with an exemplary embodiment.

Principles of the present disclosure contemplate that, in order to make a Schottky-based photovoltaic transparent to visible light, in addition to the use of large band gap semiconductors, i.e. ZnO/ZnS heterojunction, the metallic contact should also be transparent. One exemplary approach is to deposit a very thin metallic film onto the heterojunction. Typically, the thickness needs to be under 10 nm. For example, an average visible transmittance between 40-80% is found in Ni thin films with a thickness of 2-10 nm. However, as a film becomes more transparent with its thickness approaching 20 nm, the sheet resistance significantly increases due to electron scattering from the surface, and the conductivity differs significantly from its bulk counterpart. Another exemplary approach is to use nanomaterial-based metallic transparent electrodes, which have demonstrated excellent performance. However, the fabrication involves expensive vacuum deposition techniques, making them cost prohibitive for many practical applications, such as smart windows. In various exemplary embodiments, exemplary methods deposit a low cost solution grown Cu nanowire network, as the fully transparent electrode, onto ZnO/ZnS heterojunction to form a Schottky-based photovoltaic, as shown in FIG. 16C. In certain exemplary embodiments, the synthesis may be carried out using a simple reduction of $Cu^{2+}$ by $Ni^{2+}$ under Ar atmosphere to form Cu nanowires in the presence of surfactants. The morphology and transmittance of the resulted Cu nanowires at various concentrations are shown in FIGS. 16A and 16B, respectively. Principles of the present disclosure incorporate good conductivity of the Cu nanowire network, and identify suitable processing conditions to achieve good Schottky contact between Cu nanowire network and ZnS surface, including 1) low temperature annealing to ensure the process is compatible with plastic substrate, and/or 2) chemical solution treatment.

In various exemplary embodiments, there are several ways Cu—ZnS/ZnO Schottky UV solar cells can be integrated with EC layer, either side by side of the two devices, or having the solar cell positioned at the peripheral of the EC device. These strategies will either limit EC controlled area in the first case, or the solar cell area in the second case. Therefore, to maximize the performance, the third choice of monolithically integrating a solar cell with an EC layer is desirable. In addition, in order to explore the feasibility of potentially retrofitting such self-powered smart window onto a vast amount of existing windows, exemplary methods contemplate fabricating these devices on flexible substrate.

In an exemplary embodiment, similar to the fabrication of Cu—ZnS/ZnO Schottky diodes, an exemplary method first deposits ITO electrode layer on PET substrate, followed by the deposition of ZnO film through solution synthesis. After defining the ITO contacts with the ZnO films using photolithography, an insulating layer, such as $SiO_2$ is sputter-deposited on top of the device to provide electrical insulation between the two contacts. On top of the insulating layer, an EC cell is fabricated. Another ITO contact layer is deposited on the insulating layer, followed by the thermal evaporation of $WO_3$ (EC layer), $LiAlF_4$ (ion conductor) and $V_2O_5$ (the ion-storage layer), respectively. A third layer of ITO film is deposited on top to serve as the top electrode for the EC cell. One of the contacts of the Cu—ZnS/ZnO UV solar cell is connected to the bottom electrode of the EC cell, while the other contact from the UV solar cell is connected to the top ITO contact. An exemplary finished device is illustrated in FIG. 6. Because all the processes involved are at low temperature, it is compatible with polymer substrate.

In an exemplary configuration, the photovoltage produced by the Cu—ZnS/ZnO solar cell electrode drives electrons and compensating $Li^+$ cations from the $WO_3$ film, resulting in a colored electrochromic film. When illumination ceases, the potential of the charged $WO_3$ film causes the coloration process to reverse, expelling $Li^+$ from the $WO_3$ film and transferring electrons, via the external circuit, back to the oxidized iodine species in solution.

To characterize such self-powered smart window structure, an AM1.5 light source may be shined on the device and the light intensity may be varied to examine under what conditions the electrochromic layer will undergo a coloration process. In particular, the voltage generated by the solar cell after an exemplary hybrid device is fabricated determines the additional process steps, if any, that will degrade the UV solar cell characteristics. As the desired voltage for driving ionic conduction in such EC material is in the range of 0.5-3V, such monitoring assists in evaluating the device performance. Furthermore, the coloration switching time may be monitored in order to evaluate the EC device performance. Thickness of the EC layer will be used to optimize the switching time for fast response. Optical transmission, especially in the visible range, through the entire device during the coloration and de-coloration process, may be measured to evaluate the performance of such self-powered smart window in reducing the visible light transmission.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection.

What is claimed is:

1. A system integrating photovoltaic components and electrochromic components, comprising:

a glass substrate;

an electrochromic film disposed atop the glass substrate;

a UV solar cell disposed atop the electrochromic film, wherein the UV solar cell incorporates a Schottky junction, and wherein the Schottky junction comprises a ZnS/ZnO heterojunction formed by a layer of ZnS disposed atop a layer of ZnO; and a Cu nanowire network disposed atop the ZnS layer, wherein the system is oriented such that sunlight first strikes the Cu nanowire network, then the UV solar cell, then the electrochromic film, and then the glass substrate, and wherein, when the system is illuminated by sunlight first striking the system on the side comprising the Cu nanowire network, the UV solar cell absorbs less than 20% of the visible light of sunlight.

2. The system of claim 1, wherein a voltage generated by the UV solar cell is utilized to power the electrochromic film.

3. The system of claim 1, further comprising a control switch coupled between the UV solar cell and the electrochromic film.

4. The system of claim 1, wherein the voltage generated by the UV solar cell is between 0.5 volts and 3.0 volts.

5. The system of claim 1, wherein the Cu nanowire network is operative as a transparent electrode of the UV solar cell.

6. The system of claim 1, wherein, when the system is illuminated by sunlight, voltage from the UV solar cell is applied to the electrochromic film to reduce the visible light transmission of the film.

* * * * *